(12) United States Patent
Wu

(10) Patent No.: US 7,047,060 B1
(45) Date of Patent: May 16, 2006

(54) MULTIPLE PREPARATORY EXCITATIONS AND READOUTS DISTRIBUTED OVER THE CARDIAC CYCLE

(75) Inventor: Dee H. Wu, Shaker Heights, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 790 days.

(21) Appl. No.: 09/993,426

(22) Filed: Nov. 16, 2001

(51) Int. Cl.
*A61B 5/05* (2006.01)

(52) U.S. Cl. ............ 600/410; 600/407; 600/413; 600/419; 600/420; 600/424; 600/425; 600/428; 324/307; 324/309

(58) Field of Classification Search ........... 600/410, 600/413, 420, 407, 424, 428, 419, 425; 324/309, 324/307
See application file for complete search history.

(56) References Cited

U.S. PATENT DOCUMENTS

| | | | | |
|---|---|---|---|---|
| 4,710,717 | A |  | 12/1987 | Pelc et al. ............... 324/309 |
| 4,714,081 | A | * | 12/1987 | Dumoulin et al. ......... 600/419 |
| 4,953,554 | A |  | 9/1990 | Zerhouni et al. .......... 128/653 |
| 5,111,820 | A |  | 5/1992 | Axel et al. ............... 128/653 |
| 5,195,525 | A |  | 3/1993 | Pelc ..................... 128/653.2 |
| 5,217,016 | A |  | 6/1993 | Axel et al. .............. 128/653.2 |
| 5,275,163 | A |  | 1/1994 | McKinnon et al. ...... 128/653.2 |
| 5,363,043 | A |  | 11/1994 | Xiang et al. ............. 324/309 |
| 5,363,044 | A |  | 11/1994 | Xiang et al. ............. 324/309 |
| 5,377,680 | A |  | 1/1995 | Bernstein et al. ........ 128/653.2 |
| 5,379,766 | A |  | 1/1995 | McKinnon et al. ...... 128/653.2 |
| 5,601,084 | A | * | 2/1997 | Sheehan et al. ........... 600/450 |
| 6,171,241 | B1 |  | 1/2001 | McVeigh et al. .......... 600/410 |
| 6,442,415 | B1 | * | 8/2002 | Bis et al. ................. 600/420 |
| 6,453,187 | B1 | * | 9/2002 | Prince et al. ............. 600/410 |
| 6,510,337 | B1 | * | 1/2003 | Heuscher et al. .......... 600/428 |
| 6,597,935 | B1 | * | 7/2003 | Prince et al. ............. 600/410 |
| 6,694,166 | B1 | * | 2/2004 | Salome et al. ............ 600/410 |
| 6,721,589 | B1 | * | 4/2004 | Zhu et al. ................ 600/413 |

FOREIGN PATENT DOCUMENTS

| | | |
|---|---|---|
| EP | 0 507 392 A2 | 10/1992 |
| EP | 0 802 423 A1 | 10/1997 |
| WO | WO 00/48511 | 8/2000 |
| WO | WO 01/40820 | 6/2001 |

OTHER PUBLICATIONS

Park, et al. "Cascased MRI-SPAMM for LV Motion Analysis During A Whole Cardiac Cycle", Int. J. Med. Inf. 55 (2); 117-126 (1999).

(Continued)

*Primary Examiner*—Ali Imam
*Assistant Examiner*—Baisakhi Roy
(74) *Attorney, Agent, or Firm*—Fay, Sharpe, Fagan, Minnich & McKee

(57) ABSTRACT

A magnetic resonance cardiac imaging method for imaging during a cardiac cycle interval includes monitoring an electrocardiographic signal (90) associated with the imaged heart for a first trigger event (102). Responsive to the first trigger event, a data acquisition sequence (112, 120) is applied, including a first preparation sequence block (114), a first imaging sequence block (116) having at least one readout interval (228) that collects first data (118), a second preparation sequence block (122), and a second imaging sequence block (124) having at least one readout interval (228) that collects second data (126). The data acquisition sequence (112, 120) occupies an acquisition time interval which is less than the cardiac cycle interval of the imaged heart.

21 Claims, 18 Drawing Sheets

OTHER PUBLICATIONS

Doyle, et al. "Common k-Space Acquisition: A Method to Improve Myocardial Grid-Tag Contrast", MRM 37: 754-763 (1997).

Fischer, et al. "Improved Myocardial Tagging Contrast", MRM 30: 191-200 (1993).

Stuber, et al. "Toward High-Resolution Myocardial Tagging", MRM 41: 639-643 (1999).

Fischer, et al. "True Myocardial Motion Tracking", MRM: 401-413 (1994).

Simonetti, et al. "An Improved MR Imaging Technique For the Visualization of Myocardial Infarction", Radiology 2001; 218: 215-223.

Collins, et al. "SAR and $B_1$ Field Distributions in a Heterogeneous Human Head Model Within a Birdcage Coil", MRM 40: 847-856 (1998).

Axel, "Heart Wall Motion: Improved Method of Spatial Modulation of Magnetization for MR Imaging", Radiology 1989; 172: 349-350.

Axel, "MR Imaging of Motion With Spatial Modulation of Magnetization", Radiology 1989; 171: 841-845.

Bohning, et al. "PC-Based System For Retrospective Cardiac and Respiratory GAting of NMR Data", MRM 16: 303-316 (1990).

* cited by examiner

| CC | Prep. 1 | SPAMM k-space lines | | | | | | | | Prep. 2 | Perfusion |
|---|---|---|---|---|---|---|---|---|---|---|---|
| 1 | tag | 1 | 9 | 17 | 25 | 33 | 41 | 49 | 57 | 180 deg. | Image |
| 2 | C-tag | 1 | 9 | 17 | 25 | 33 | 41 | 49 | 57 | 180 deg. | Image |
| 3 | tag | 2 | 10 | 18 | 26 | 34 | 42 | 50 | 58 | 180 deg. | Image |
| 4 | C-tag | 2 | 10 | 18 | 26 | 34 | 42 | 50 | 58 | 180 deg. | Image |
| 5 | tag | 3 | 11 | 19 | 27 | 35 | 43 | 51 | 59 | 180 deg. | Image |
| 6 | C-tag | 3 | 11 | 19 | 27 | 35 | 43 | 51 | 59 | 180 deg. | Image |
| 7 | tag | 4 | 12 | 20 | 28 | 36 | 44 | 52 | 60 | 180 deg. | Image |
| 8 | C-tag | 4 | 12 | 20 | 28 | 36 | 44 | 52 | 60 | 180 deg. | Image |
| 9 | tag | 5 | 13 | 21 | 29 | 37 | 45 | 53 | 61 | 180 deg. | Image |
| 10 | C-tag | 5 | 13 | 21 | 29 | 37 | 45 | 53 | 61 | 180 deg. | Image |
| 11 | tag | 6 | 14 | 22 | 30 | 38 | 46 | 54 | 62 | 180 deg. | Image |
| 12 | C-tag | 6 | 14 | 22 | 30 | 38 | 46 | 54 | 62 | 180 deg. | Image |
| 13 | tag | 7 | 15 | 23 | 31 | 39 | 47 | 55 | 63 | 180 deg. | Image |
| 14 | C-tag | 7 | 15 | 23 | 31 | 39 | 47 | 55 | 63 | 180 deg. | Image |
| 15 | tag | 8 | 16 | 24 | 32 | 40 | 48 | 56 | 64 | 180 deg. | Image |
| 16 | C-tag | 8 | 16 | 24 | 32 | 40 | 48 | 56 | 64 | 180 deg. | Image |

| CC | Prep.1 | SPAMM k-space lines | | | | | | | | Prep.2 | Perfusion |
|----|--------|---|---|---|---|---|---|---|---|--------|-----------|
| 1  | tag    | 1 | 9  | 17 | 25 | 33 | 41 | 49 | 57 | 180 deg. | Image |
| 2  | tag    | 2 | 10 | 18 | 26 | 34 | 42 | 50 | 58 | 180 deg. | Image |
| 3  | tag    | 3 | 11 | 19 | 27 | 35 | 43 | 51 | 59 | 180 deg. | Image |
| 4  | tag    | 4 | 12 | 20 | 28 | 36 | 44 | 52 | 60 | 180 deg. | Image |
| 5  | tag    | 5 | 13 | 21 | 29 | 37 | 45 | 53 | 61 | 180 deg. | Image |
| 6  | tag    | 6 | 14 | 22 | 30 | 38 | 46 | 54 | 62 | 180 deg. | Image |
| 7  | tag    | 7 | 15 | 23 | 31 | 39 | 47 | 55 | 63 | 180 deg. | Image |
| 8  | tag    | 8 | 16 | 24 | 32 | 40 | 48 | 56 | 64 | 180 deg. | Image |
| 9  | C-tag  | 1 | 9  | 17 | 25 | 33 | 41 | 49 | 57 | 180 deg. | Image |
| 10 | C-tag  | 2 | 20 | 28 | 36 | 44 | 52 | 60 | 68 | 180 deg. | Image |
| 11 | C-tag  | 3 | 11 | 19 | 27 | 35 | 43 | 51 | 59 | 180 deg. | Image |
| 12 | C-tag  | 4 | 12 | 20 | 28 | 36 | 44 | 52 | 60 | 180 deg. | Image |
| 13 | C-tag  | 5 | 13 | 21 | 29 | 37 | 45 | 53 | 61 | 180 deg. | Image |
| 14 | C-tag  | 6 | 14 | 22 | 30 | 38 | 46 | 54 | 62 | 180 deg. | Image |
| 15 | C-tag  | 7 | 15 | 23 | 31 | 39 | 47 | 55 | 63 | 180 deg. | Image |
| 16 | C-tag  | 8 | 16 | 24 | 32 | 40 | 48 | 56 | 64 | 180 deg. | Image |

FIG 14

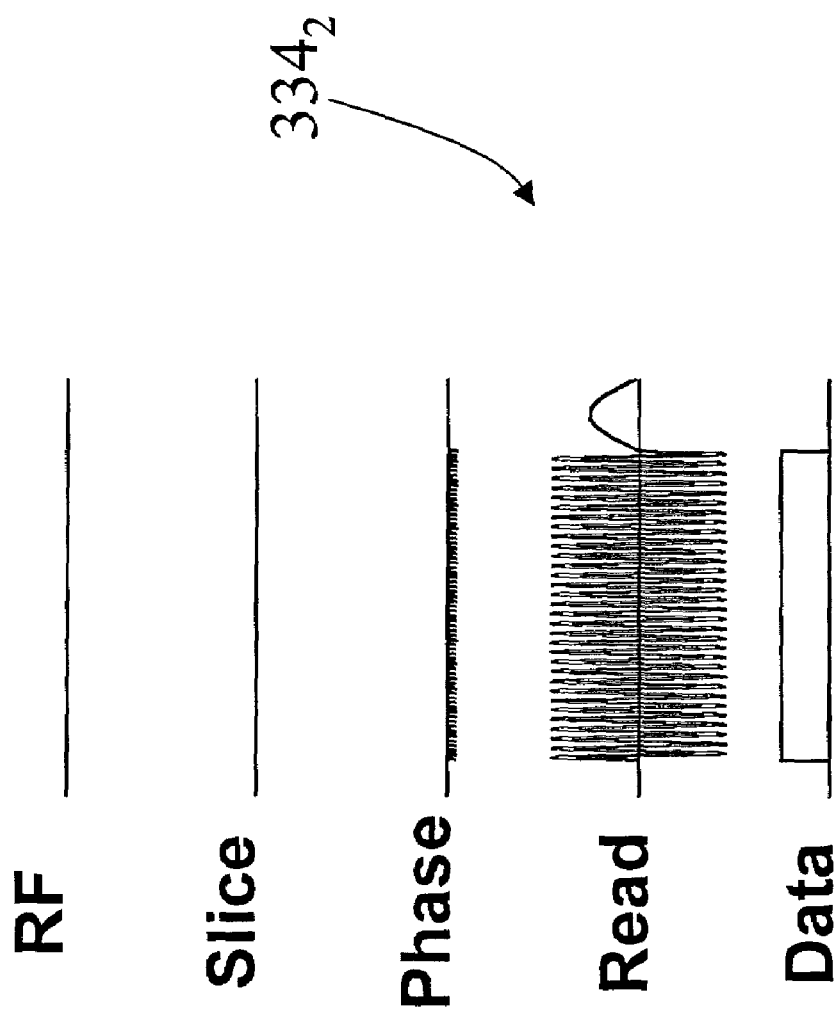

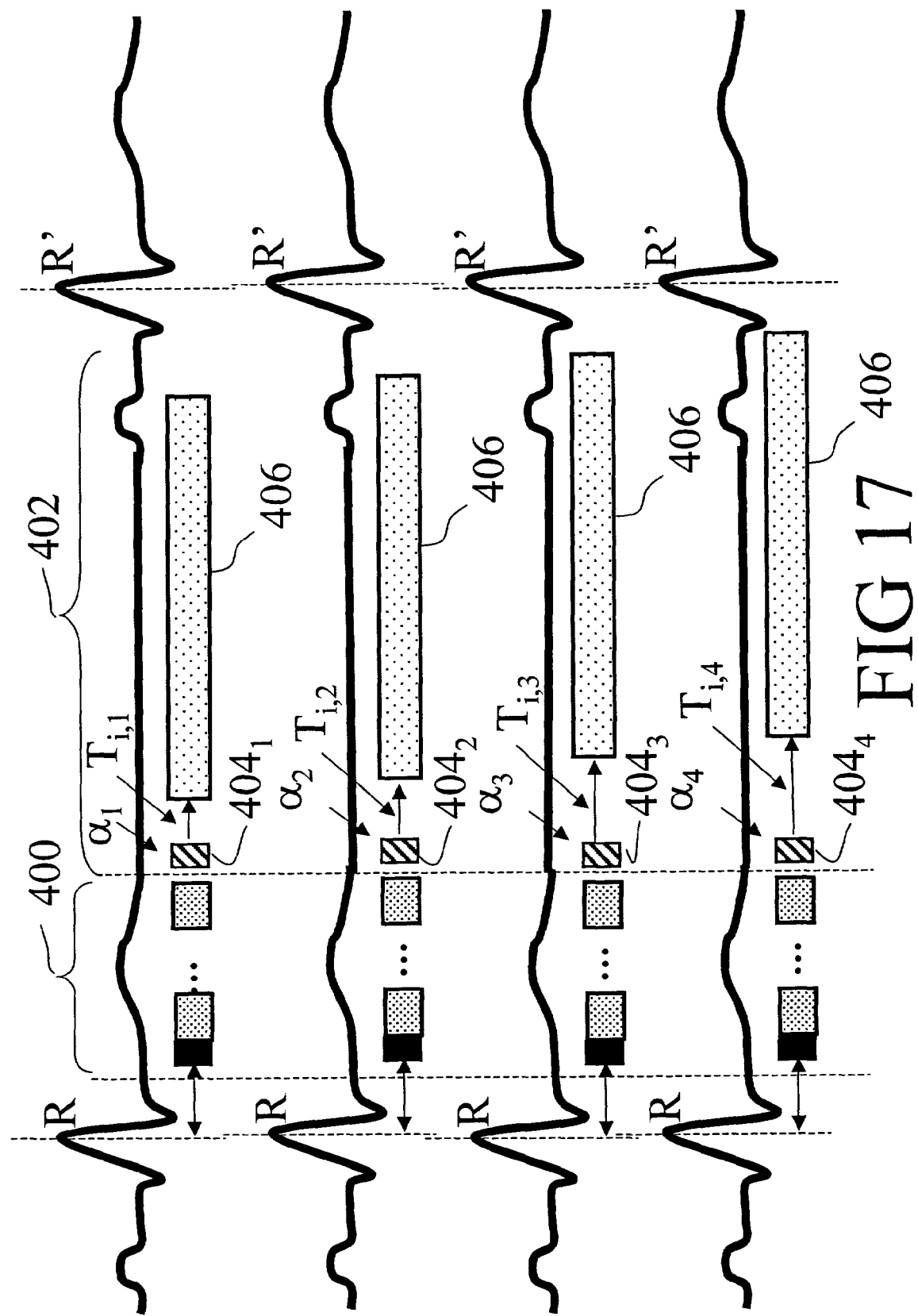

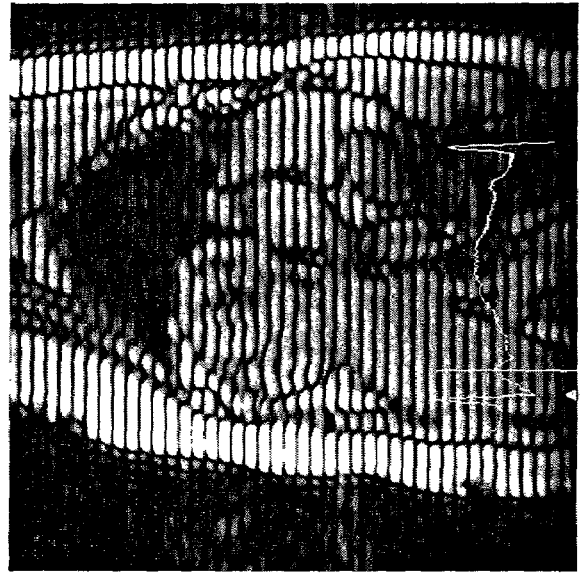
FIG 18A $IMC_{3/64}$
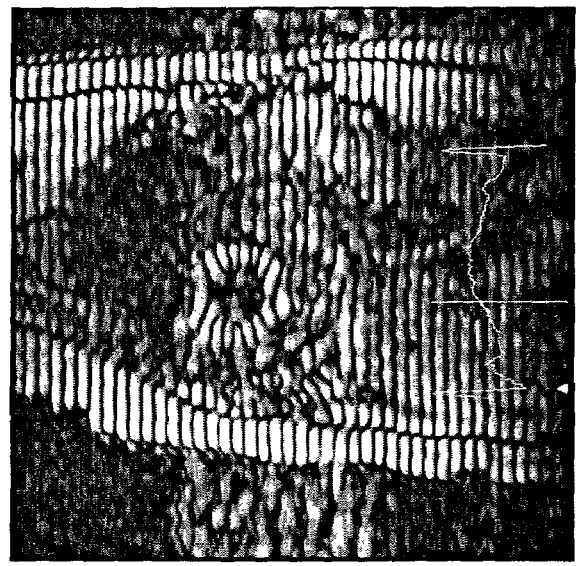
FIG 18B $IMC_{22/64}$
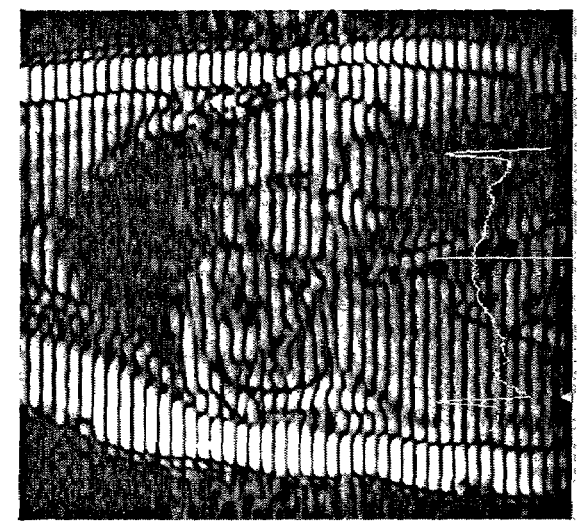
FIG 18C $IMC_{42/64}$

MULTIPLE PREPARATORY EXCITATIONS AND READOUTS DISTRIBUTED OVER THE CARDIAC CYCLE

BACKGROUND OF THE INVENTION

The present invention relates to the medical imaging arts. It particularly relates to cardiac imaging using magnetic resonance imaging (MRI) techniques, and will be described with particular reference thereto. However, the invention will also find application in conjunction with other magnetic resonance-based imaging applications and other imaging applications in which a spatially or temporally selective preparatory excitation of the imaged subject is employed.

Magnetic resonance imaging (MRI) of the heart provides a powerful diagnostic and monitoring tool which is useful in treating coronary diseases and other heart ailments. MRI is non-invasive (except for contrast-enhanced MRI) and is capable of imaging quickly enough to monitor the cardiac cycle in real time. The combination of MRI with an electrocardiograph (ECG) that non-invasively monitors the cardiac cycle enables controlled medical imaging of selected phases of the cardiac cycle, e.g. the systolic or diastolic cardiac phases.

One application of cardiac MRI is measurement of the motion of the heart muscle. Forces, stresses, and strains on the heart during the cardiac cycle can be monitored by MRI. However, initially, the lack of spatial reference points made interpretation of MRI cardiac stress/strain images difficult.

The spatial modulation of magnetization (SPAMM) technique was developed to alleviate this difficulty. An exemplary SPAMM process is described with reference to FIG. 1, where an electrocardiogram ECG is schematically shown. A first cardiac cycle $CC_1$ is shown in full, with several conventionally recognized points in the electrocardiogram ECG labeled: namely the atrial depolarization P, ventricular depolarization Q, R, S, and ventricular repolarization T. A second cardiac cycle $CC_2$ with points P', Q', R', S', T' labeled is shown in part. The SPAMM data acquisition is triggered by a selected electrocardiographic gating event G, such as the occurrence of the R peak. After a selected gating delay GD, a tag sequence TAG is applied.

As is known to the art, an appropriate tag sequence TAG typically includes one or more radio frequency (RF) pulses such as binomial RF pulses in combination with selected magnetic field gradients that "wrap" the magnetization phase spatially to create a spatially periodic magnetization phase variation. The RF pulse and selected field gradients cooperate to generate a spatial variation in the magnetization of the cardiac tissues, usually including sinusoidal modulation in two directions forming a two dimensional cross-hatched magnetization pattern in the cardiac tissues that extends in planar fashion perpendicularly to the imaging plane.

The preparatory tagging sequence TAG is followed by one or more magnetic resonance image data acquisition sequence blocks $I_1, I_2, I_3, \ldots I_n$. The blocks $I_1, I_2, I_3, \ldots I_n$ image the cross-hatched magnetization pattern or tags superimposed on the cardiac images. As the cardiac muscle moves in accordance with the cardiac cycle, the tag portions associated with the cardiac tissue move as well. The tag portions associated with the stationary portions of the chest cavity remain stationary, thus providing the desired reference points to track the cardiac muscle motion during the cardiac cycle.

With continuing reference to FIG. 1 and with further reference to FIG. 2A, a typical SPAMM image $I_{3/64}$ corresponding to phase=3/64 of the cardiac cycle $CC_1$ is shown. The superimposed tags appear as horizontal dark and bright lines. Since tag portions are associated with the cardiac tissue and the stationary chest walls, they provide convenient reference points for monitoring the motion of the heart over the cardiac cycle $CC_1$ through the sequential MRI image data blocks $I_1, I_2, I_3, \ldots I_n$. In the exemplary FIG. 2A, tags have been generated in only one direction for simplicity, rather than employing a more commonly used cross-hatching tag pattern.

After the imaging data acquisition, a trigger window TW trails the data acquisition sequence and terminates at a recurrence G' of the trigger event. In this manner, the actual cardiac cycle interval can be measured as the time interval between trigger events G, G'.

Typically, data acquisition rate limitations dictate the use of segmented SPAMM imaging. In segmented SPAMM, only a few lines of k-space are acquired for a given cardiac cycle interval, e.g. for the cardiac cycle interval $CC_1$. The data acquisition blocks $I_1, I_2, I_3, \ldots I_n$ are repeated over a plurality of cardiac cycle intervals to acquire a full segmented SPAMM k-space data set which is then reconstructed in the usual way. For example, if there are 256 k-space lines which are to be acquired over 32 cardiac cycle intervals, the image data blocks $I_1, I_2, I_3, \ldots I_n$ during the first cardiac cycle interval acquire the k-space lines 1, 33, 65, . . . 225. The k-space lines 2, 34, 66, . . . 226 are acquired during the second cardiac cycle, and so on until the thirty-second cardiac cycle acquires the k-space lines 32, 64, . . . 256, which complete the data sets.

As is well-known to those skilled in the art, the conventional SPAMM method has a significant operative limitation. With continuing reference to FIG. 2A and with further reference to FIGS. 2B and 2C, which show later images $I_{22/64}, I_{42/64}$ corresponding to phases 22/64 and 42/64 of the cardiac cycle interval, respectively, it is seen that the tags do not persist through the cardiac cycle interval, but instead gradually blur out and decay due to $T_1$ relaxation effects. Typically, the tags persist for less than 0.5 second, while the cardiac cycle is typically close to 1 second (i.e., corresponding to a heart rate of 60 beats per second). Furthermore, tag persistence can be reduced by factors such as the presence of a magnetic resonance contrast agent in contrast-enhanced MRI. As seen in FIG. 1, an approach to this limited tag persistence is to select the gating delay GD appropriately so as to examine the portion of the cardiac cycle of interest. However, the lack of tag persistence means that SPAMM does not usefully image a large portion of the cardiac cycle interval.

A variation on the SPAMM technique, called complementary spatial modulation of magnetization (CSPAMM), was developed to overcome the tag blurring encountered in SPAMM. In CSPAMM, a first SPAMM sequence is run in a first cardiac cycle interval. A second SPAMM sequence is run in a second cardiac cycle interval, but with the tags' magnetization phase-shifted 180° relative to the tag magnetizations produced in the first cardiac cycle interval. The corresponding k-space data from the first and second cardiac cycle intervals are subtracted to produce the CSPAMM image. The subtracting cancels out the $T_1$ relaxation in the two images, and so tag persistence is greatly improved. As with SPAMM, data acquisition rate limitations usually dictate acquisition of CSPAMM data in a segmented mode over a plurality of cardiac cycle intervals.

With reference to FIGS. 3A through 3C, exemplary CSPAMM images $I_{3/64}, I_{22/64}, I_{42/64}$ are shown at phases 3/64, 22/64, and 42/64. This images are CSPAMM images corresponding to the SPAMM images of FIGS. 2A through 2C. It is seen that the CSPAMM images exhibit strong tag persistence all the way out to phase=42/64.

However, as is well-known to those skilled in the art, a significant limitation of CSPAMM is that the image fades while the tags persist. This fading arises because the canceled $T_1$ relaxation component contributes significantly to the image contrast, and so as the $T_1$ relaxation increases with time subsequent to the tagging, its removal by the subtracting severely degrades the image contrast. This effect is clearly seen in FIG. 3C, where although the tag contrast is quite strong, the cardiac image contrast is almost completely faded out by phase 42/64. Thus, the tag persistence achieved by CSPAMM does not translate into useful imaging of the entire cardiac cycle interval, because the image fades.

The present invention contemplates an improved imaging method for imaging in conjunction with tags or other preparatory sequences which overcomes the aforementioned limitations and others.

SUMMARY OF THE INVENTION

According to one aspect of the invention, a magnetic resonance cardiac imaging method for imaging a heart is disclosed. A data acquisition sequence is applied. The data sequence includes a first preparation sequence block, a first imaging sequence block having at least one readout interval that collects first data, a second preparation sequence block, and a second imaging sequence block having at least one readout interval that collects second data. The data acquisition sequence occupies an acquisition time interval which is less than a cardiac cycle interval of the heart.

According to another aspect of the invention, a method for reducing the specific absorption ratio (SAR) received by a patient during magnetic resonance imaging of a cardiac cycle interval is disclosed. A first preparatory sequence block is applied to the patient at a first point in the cardiac cycle interval. First image data is acquired responsive to the first preparatory sequence block. A second preparatory sequence block is applied to the patient at a second point in the cardiac cycle interval. Second image data is acquired responsive to the second preparatory sequence block.

According to yet another aspect of the invention, an apparatus for acquiring image data associated with cardiac cycling of a heart is disclosed. A magnetic resonance imaging (MRI) scanner is arranged to interact with at least a portion of the heart. An electrocardiograph monitors the cardiac cycling. An imaging sequence processor communicating with the MRI scanner and the electrocardiograph performs an MRI data acquisition sequence with timing coordinated by a signal from the electrocardiograph. The data acquisition sequence includes a first preparatory sequence block that produces a first modification of heart magnetization, a first imaging sequence block including at least one readout that produces first image data associated with the heart, a second preparatory sequence block that produces a second modification of heart magnetization, and a second imaging sequence block including at least one readout that produces second image data associated with the heart. The data acquisition sequence occurs over an acquisition time interval which is smaller than a cardiac cycle interval. A reconstruction processor reconstructs first and second image data to form a plurality of image representations of the heart which are associated with selected portions of the cardiac cycle.

One advantage of the present invention is that it facilitates useful cardiac stress/strain/motion imaging throughout the entire cardiac cycle interval.

Another advantage of the present invention is that it enables use of a plurality of imaging modalities within a single cardiac cycle interval, such as cardiac stress/strain/motion imaging and perfusion imaging.

Another advantage of the present invention is that it more efficiently uses MRI imaging time. This advantage is of particular importance in clinical settings where patient throughput is a significant consideration.

Yet another advantage of the present invention is that it reduces the specific absorption ratio (SAR) delivered to the patient by distributing tags or preparatory sequence blocks over the cardiac cycle interval and allowing each tag or preparatory sequence block to employ a reduced angle of excitation. Since the SAR is proportional to the square of the pulse amplitude, significant SAR reduction can be achieved.

Numerous additional advantages and benefits of the present invention will become apparent to those of ordinary skill in the art upon reading the following detailed description of the preferred embodiment.

BRIEF DESCRIPTION OF THE DRAWINGS

The invention may take form in various components and arrangements of components, and in various steps and arrangements of steps. The drawings are only for the purpose of illustrating preferred embodiments and are not to be construed as limiting the invention.

FIG. 13 schematically shows an exemplary arrangement of segmented CSPAMM k-space line acquisitions and perfusion image acquisitions in which the SPAMM tags and complementary SPAMM tags are distributed over sixteen cardiac cycles;

FIG. 14 schematically shows another exemplary arrangement of segmented CSPAMM k-space line acquisitions and perfusion image acquisitions in which the SPAMM tags and complementary SPAMM tags are distributed over sixteen cardiac cycles;

FIG. 16 shows an alternative readout sequence block for use in the timing diagram of FIG. 9;

FIG. 17 schematically shows the timing diagram of yet another exemplary multiple-excitation cardiac imaging embodiment in which a SPAMM or CSPAMM segmented imaging data acquisition is combined with late enhancement imaging during a single cardiac cycle interval; and FIG. 18A, 18B, 18C show exemplary multiple-excitation CSPAMM images acquired in accordance with the method and apparatus of FIGS. 5 through 8 at phases 3/64, 22/64, and 42/64, respectively, of the cardiac cycle.

DETAILED DESCRIPTION OF THE PREFERRED EMBODIMENTS

Figure 4:
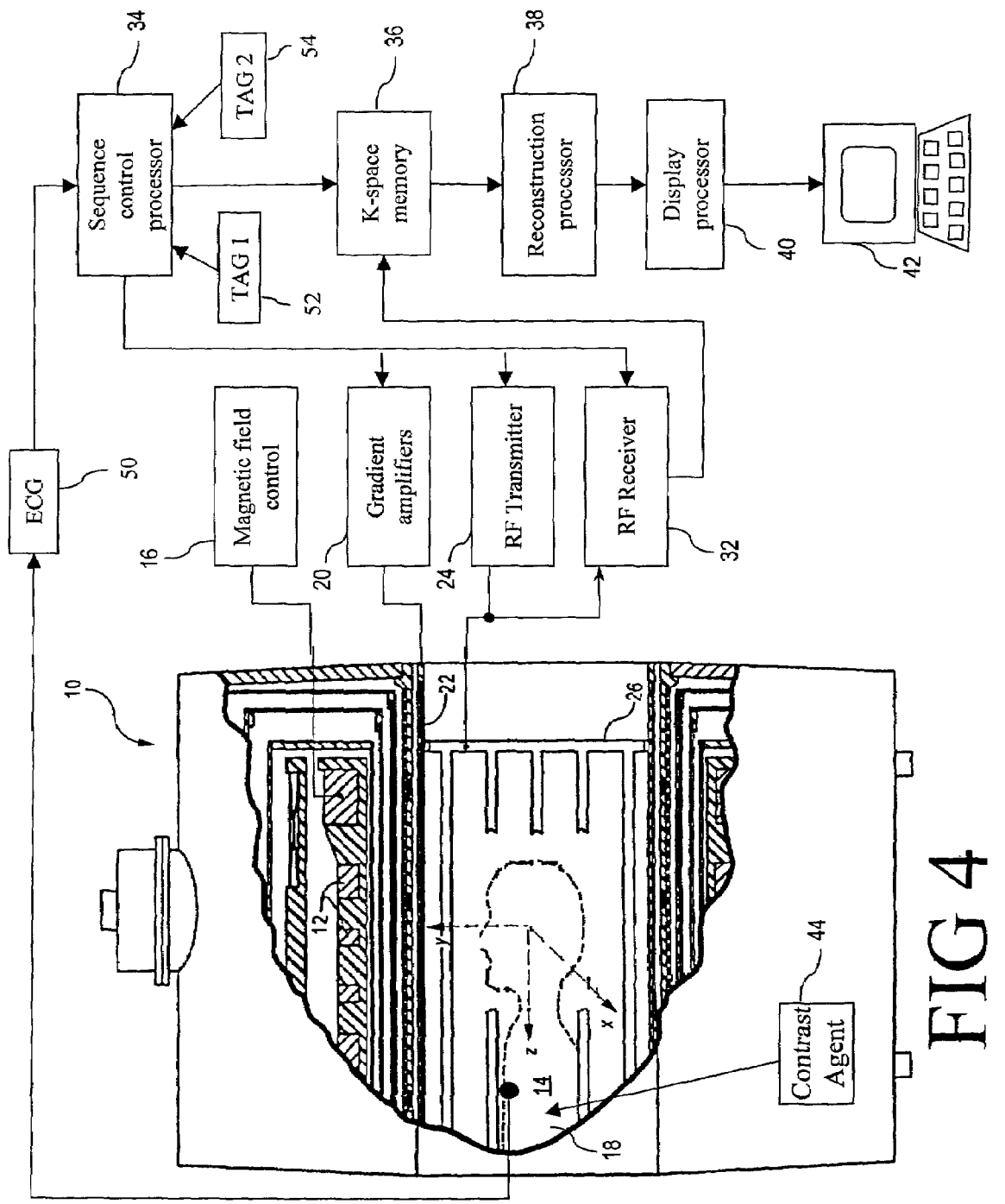
FIG. 4 shows an exemplary magnetic resonance imaging apparatus configured to perform cardiac imaging with multiple-excitations and readouts in a single cardiac cycle interval.

With reference to FIG. 4, an apparatus that suitably practices an embodiment of the invention is described. A magnetic resonance imaging (MRI) scanner 10 typically includes superconducting or resistive magnets 12 that create a substantially uniform, temporally constant main magnetic field $B_0$ along a z-axis through an examination region 14. Although a bore-type magnet is illustrated in FIG. 4, the present invention is equally applicable to open magnet systems and other known types of MRI scanners. The magnets 12 are operated by a main magnetic field control 16. Imaging is conducted by executing a magnetic resonance (MR) sequence with the subject being imaged, e.g. a patient 18, placed at least partially within the examination region 14, typically with the region of interest at the isocenter.

The magnetic resonance sequence entails a series of RF and magnetic field gradient pulses that are applied to the subject to invert or excite magnetic spins, induce magnetic resonance, refocus magnetic resonance, manipulate magnetic resonance, spatially and otherwise encode the magnetic resonance, to saturate spins, and the like. More specifically, gradient pulse amplifiers 20 apply current pulses to a whole body gradient coil assembly 22 to create magnetic field gradients along x-, y-, and z-axes of the examination region 14.

An RF transmitter 24, preferably digital, applies RF pulses or pulse packets to a whole-body RF coil 26 to transmit RF pulses into the examination region. A typical RF pulse is composed of a packet of immediately contiguous pulse segments of short duration which taken together with each other and any applied gradients achieve a selected magnetic resonance manipulation. The RF pulses are used to saturate, excite resonance, invert magnetization, refocus resonance, or manipulate resonance in selected portions of the examination region.

For whole-body applications, the resulting resonance signals, generated as a result of a selected manipulation, are also picked up by the whole-body RF coil 26. Alternately, for generating RF pulses in limited regions of the subject, local RF coils are placed contiguous to the selected region. For example, as is known in the art, an insertable head coil or other such specialized RF coils (not shown) may also be employed. For example, the RF system optionally includes a phased array receive coil (not shown) whereby partial parallel imaging (PPI) techniques known to the art are enabled. In one embodiment, the whole-body RF coil 26 induces resonance and a local RF coil or coil array receives magnetic resonance signals emanating from the selected region. In other embodiments, the local RF coil both excites and receives the resulting magnetic resonance signals.

Regardless of the RF coil configuration and the application thereof, the resultant RF magnetic resonance signals that are picked up by one or another of the RF coils is received and demodulated by an RF receiver 32. A sequence control processor 34 controls the gradient pulse amplifiers 20, the RF transmitter 24, and the RF receiver 32 to produce integrated MRI pulse sequence and readout waveforms that generate the magnetic resonance (MR) signals and optional echoes, provide appropriate encoding gradients to spatially encode the resultant MR response, and coordinate MR pickup and receive operations.

The MRI sequence typically includes a complex series of magnetic field gradient pulses and/or sweeps generated by the gradient amplifiers 20 which along with selected RF pulses generated by RF coils 26 result in magnetic resonance echoes that map into k-space. The resultant magnetic resonance data is stored in a k-space memory 36. The k-space data is processed by a reconstruction processor 38, which is typically an inverse Fourier transform processor or other reconstruction processor known to the art, to produce a reconstructed image representation. A display processor 40 formats the CSPAMM images appropriately for display on a display device 42. Of course, the imaging results can be processed in other ways besides displaying, such as printing on a high resolution printer, inputting into animation software, transferring across a computer network, or the like.

In cardiac cycle imaging, the patient 18 is imaged by the MRI system 10 using imaging conditions that particularly emphasize the heart muscle, blood tissue, blood movement or flow, blood perfusion into tissues, or other aspect of clinical interest. Optionally, a magnetic resonance contrast agent 44 is administered to the patient 18 to improve contrast of selected features, such as the blood. Contrast agents selected from the gadolinium or Dysprosium families of agents are often used for cardiac imaging. Although useful for enhancing vascular contrast, contrast agents can exacerbate the image fading problem in CSPAMM. Additionally, for cardiac cycle imaging the cardiac cycle is advantageously independently monitored non-invasively using an electrocardiograph (ECG) 50. An appropriate imaging sequence such as a SPAMM or CSPAMM sequence is applied. Substantially the entire cardiac cycle is characterized using one or more imaging methods by applying a plurality of preparatory sequences during each cardiac cycle interval. For example, in multiple-excitation CSPAMM a plurality of SPAMM tags 52, 54 are applied at pre-selected points during each cardiac cycle interval.

Figure 5:
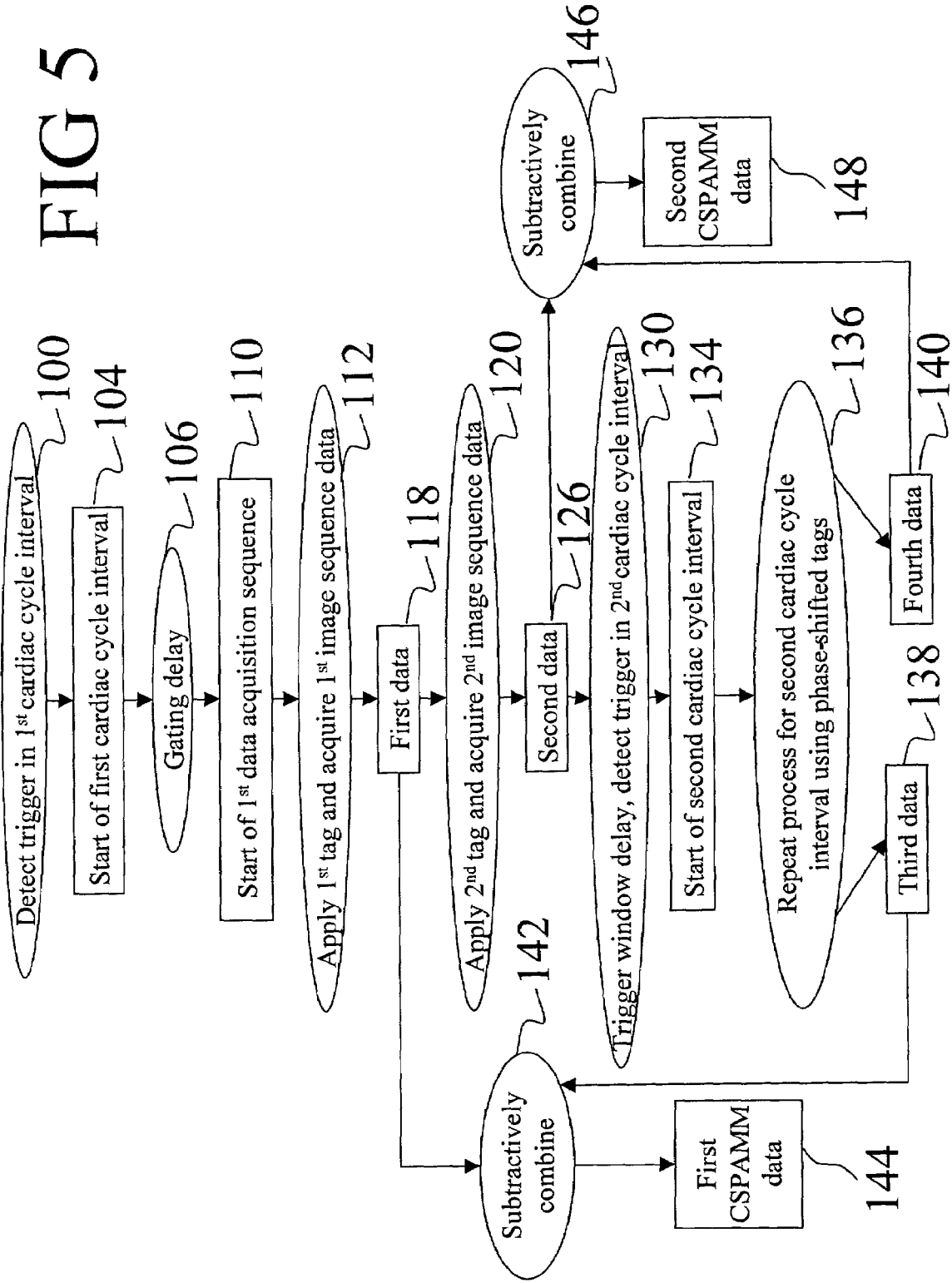
FIG. 5 shows an exemplary multiple-excitation CSPAMM data acquisition method using two SPAMM tags per cardiac cycle interval.
Figure 6:
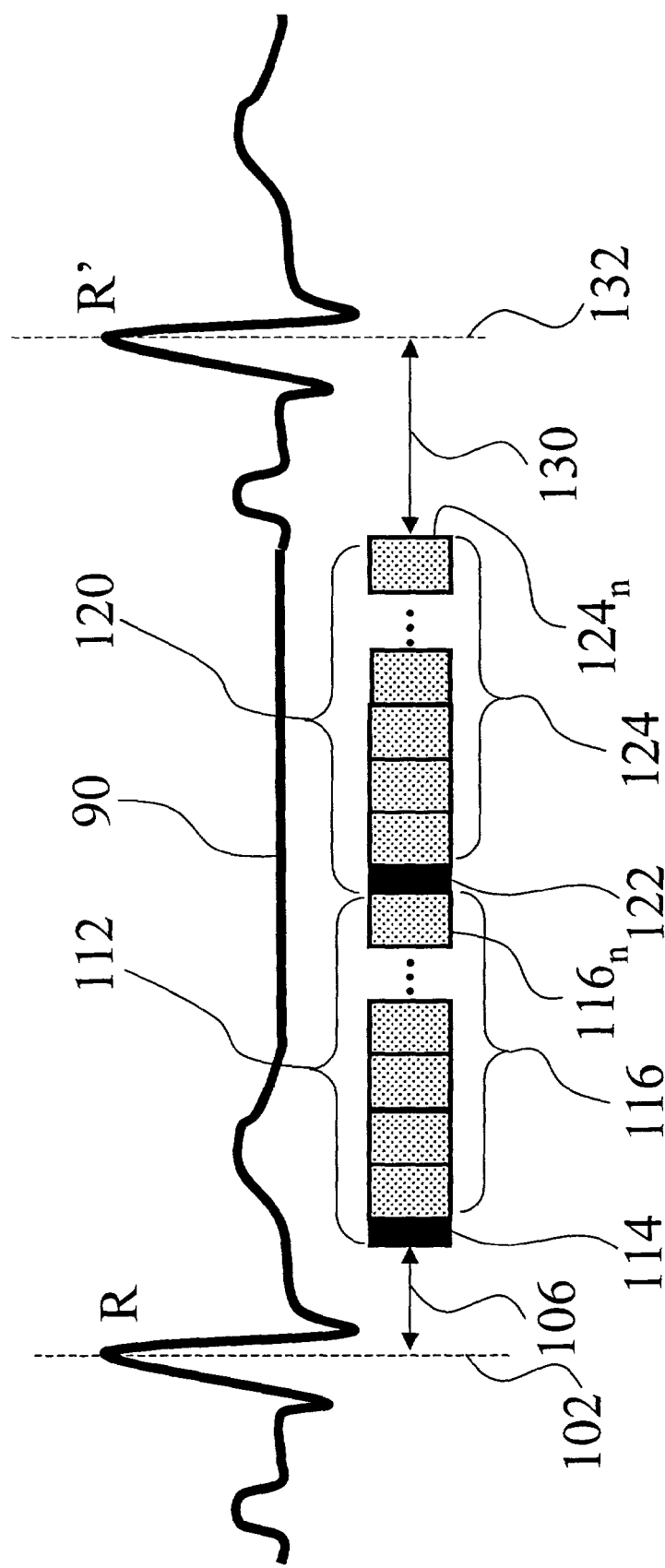
FIG. 6 schematically shows the timing diagram of the exemplary multiple-excitation CSPAMM imaging of FIG. 5 referenced to a corresponding electrocardiogram.

With reference to FIGS. 5 and 6, an exemplary process for obtaining a portion of segmented multiple-excitation CSPAMM image data is described. The electrocardiograph 50 produces an electrocardiogram 90 that is monitored 100 for a trigger event 102, such as an occurrence of the R pulse. Detection 100 of the trigger event 102 indicates the start of a cardiac cycle interval 104. It will be appreciated that although the trigger 102 corresponds to the R peak in FIG. 6, the cardiac cycle interval can be defined to begin and end at any convenient recurring reference point within the cardiac cycle. Once the start of the cardiac interval 104 is identified, the start of the data acquisition sequence is delayed by a selected gating delay 106. In conventional CSPAMM, only a limited portion of the cardiac cycle is measurable due to the temporal decay of the image contrast, and so relatively long gating delays are sometimes used. The multiple-excitation CSPAMM described here uses multiple SPAMM tag excitations in a single cardiac cycle interval to effectuate useful data acquisition over as much as the entire cardiac cycle interval, and so the gating delay 106 can be shortened or even eliminated entirely.

The gating delay 106 leads to the start 110 of a first data acquisition sequence 112, which includes application of a first tag 114 followed by a data acquisition sequence block 116 comprising partial (segmented) acquisition of data for one or more individual images $116_n$, in which the individual images correspond to increasing phase values of the cardiac cycle. The first data acquisition sequence 112 acquires first data 118. The first sequence 112 is followed by a second data acquisition sequence 120, which includes a second tag 122 followed by a data acquisition sequence block 124 comprising partial (segmented) acquisition of data for one or more individual images $124_n$, in which the individual images correspond to increasing phase values of the cardiac cycle. The second data acquisition sequence 120 acquires second data 126.

A patient's heart rate typically varies significantly, usually within a range of about 20% variation, from heart beat to heart beat. Additionally, for certain medical conditions or under the influence of certain medications, a patient's heart rate can be unusually low. For these reasons, a trigger window delay 130 is advantageously included to account for such variations. The trigger window delay 130 is terminated by detection of a second trigger event 132 that indicates the start of a second cardiac cycle interval 134. Those skilled in the art will recognize that other methods such as retrospective gating can be used instead of the trigger window delay 130 to synchronize the data acquisition. In using retrospective gating to provide registration between the MRI imaging and the cardiac cycle, the cardiac cycle interval is advantageously measured using the ECG signal 90, typically averaged over a few cardiac cycle intervals. The application of the imaging sequences 112, 120 is roughly synchronized with the cardiac cycle based on the measured cardiac cycle interval. Retrospective gating can be used to provide improved temporal registration of the imaging sequences 112, 120 with the measured electrocardiogram 90.

In CSPAMM, tag persistence is improved by subtractively combining k-space data acquired with superimposed tags whose magnetization is 180° relatively out of phase. Thus, the first and second data acquisitions 112, 120 are repeated 136 with tags having the 180° magnetization phase-shift (not shown) to generate third data 138 and fourth data 140 corresponding to first data 118 and second data 126, respectively. First and third data 118, 138 are subtractively combined 142 to generate first CSPAMM data 144 corresponding to the portion of the cardiac cycle lying between the first and second tags 114, 122. Similarly, second and fourth data 126, 140 are subtractively combined 146 to generate second CSPAMM data 148 corresponding to the portion of the cardiac cycle lying between after the second tag 122.

Those skilled in the art will recognize that first and second CSPAMM data 144, 148 include, in the usual case of segmented CSPAMM, only partial k-space data, e.g., corresponding to every thirty-second k-space line in the case of CSPAMM imaging segmented over thirty-two cardiac cycle intervals. Thus, the first and second CSPAMM data 144, 148 are collected over the requisite number of cardiac cycles, with appropriate readout parameter variations from cardiac cycle-to-cardiac cycle, to acquire first and second complete CSPAMM image k-space data (combined k-space data not shown). The combined data is reconstructed to produce one or more images corresponding to the combination of first CSPAMM data 144, and one or more images corresponding to the combination of second CSPAMM data 148. By using two tags 114, 122 in each cardiac cycle interval, two different sets of CSPAMM images are acquired over the exemplary thirty-two cardiac cycles. The two sets of CSPAMM images collectively cover a substantial portion of the cardiac cycle interval.

Figure 7:
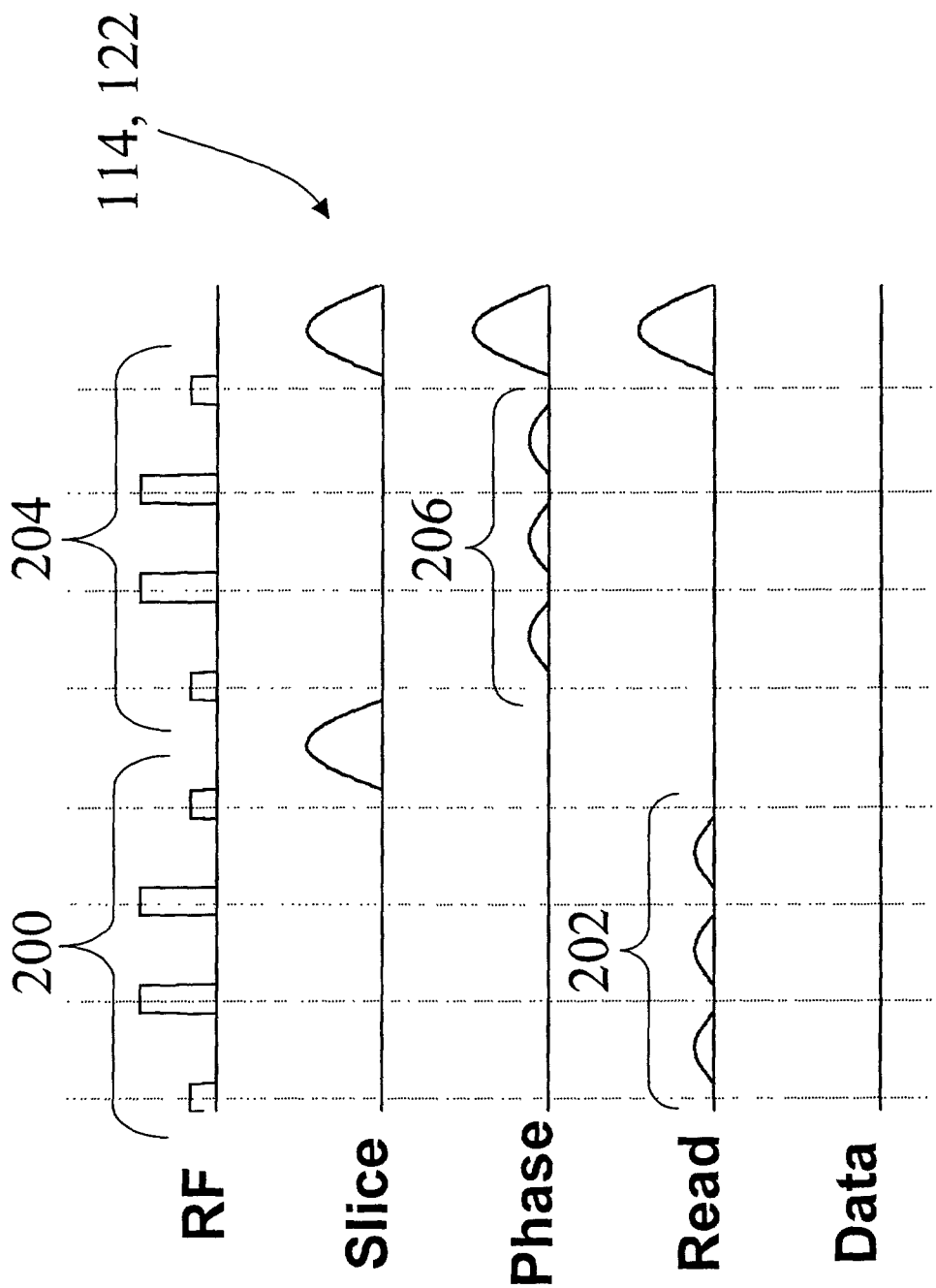
FIG. 7 schematically shows the timing diagram of an embodiment of a preparatory or tagging sequence suitable for use in the timing diagram of FIG. 6.

With reference to FIG. 7, a suitable exemplary embodiment of the tag sequence 114, 122 is shown. A first radio frequency (RF) pulse 200 includes a binomial series with interspersed "wrapping" read gradient pulses 202. This pulse/gradient sequence is known in the art to provide good SPAMM tagging characteristics in the readout direction. An orthogonal set of tag lines is formed in the phase direction by a second RF pulse 204 defining a binomial series with interspersed "wrapping" phase gradient pulses 206. Of course, the tagging sequence 114 of FIG. 7 is exemplary only, and other tagging sequences can be employed in multiple-excitation CSPAMM imaging.

Figure 8:
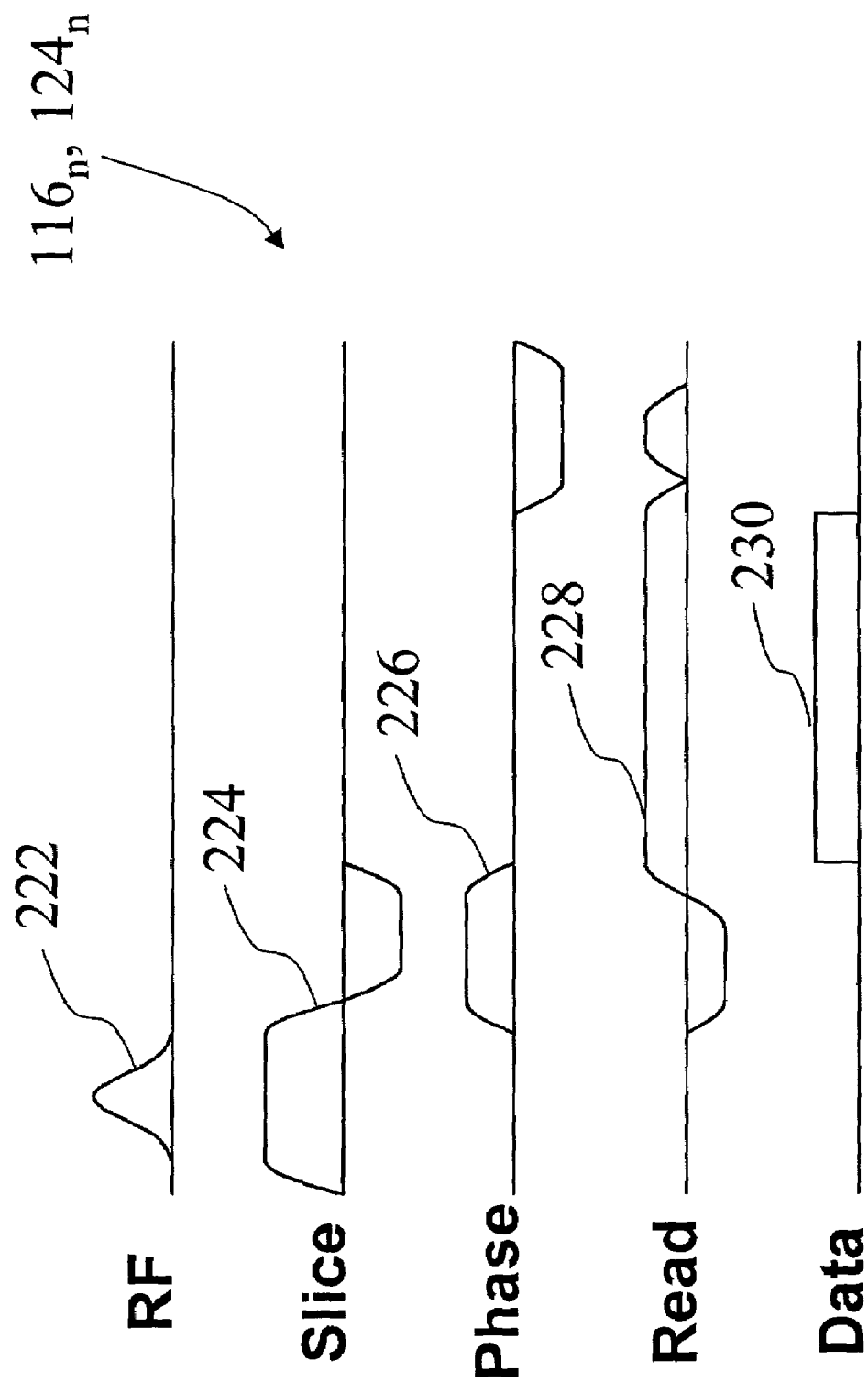
FIG. 8 schematically shows the timing diagram of an embodiment of an imaging sequence suitable for use in the timing diagram of FIG. 6.

With reference to FIG. 8, a suitable exemplary embodiment of the image data acquisition timing sequence $116_n$, $124_n$ is shown. The sequence $116_n$, $124_n$ is a gradient reversal readout sequence known to the art, and includes an RF excitation 222, slice-select gradient pulse 224, phase encoding gradient pulses 226, and readout pulses 228 which produce the schematically represented k-space data 230. Of course, other imaging readout sequences can be used. Those skilled in the art will recognize that the sequence $116_n$, $124_n$ is repeated a plurality of times to obtain the sequences of images 116, 124.

More than two tags can be included in a single cardiac cycle interval. Experimentally, up to four SPAMM tags have been included into a single cardiac cycle interval. However, significant bleed-through overlapping of tags resulted in this case. The use of only two tags per cycle, i.e. in accordance with FIGS. 5 and 6, was found to provide optimal coverage of the cardiac cycle interval with minimal tag bleed-through. However, for patients with abnormally slow heart rates due to a physiological condition or the influence of medication, the use of three or even more tags is contemplated. Similarly, three or more tags may be preferable for covering the cardiac cycle in contrast-enhanced MRI, because the contrast agent 44 (FIG. 4) typically reduces relaxation times and hence reduces the tag persistence. However, an advantage of selecting two tags per cardiac cycle interval relates to the fact that the image tagging does not register across tag applications. Thus, the use of only two tags results in only a single tag registration discontinuity per cardiac cycle interval.

The invention is not limited to multiple-excitation SPAMM or CSPAMM. In another exemplary embodiment schematically shown in FIG. 9, multiple excitations are applied during a single cardiac cycle to perform multiple monitoring functions. The electrocardiogram 90 is monitored for a trigger event 310, and after a gating delay 312 data acquisition begins. A first acquisition sequence 314 effectuates SPAMM tagging 316 followed by segmented SPAMM or CSPAMM partial image data acquisition block 318. The sequence 314 implements SPAMM or CSPAMM imaging similarly to the exemplary FIG. 6. Optionally, a delay 320 is provided after the first acquisition sequence 314.

Figure 9:
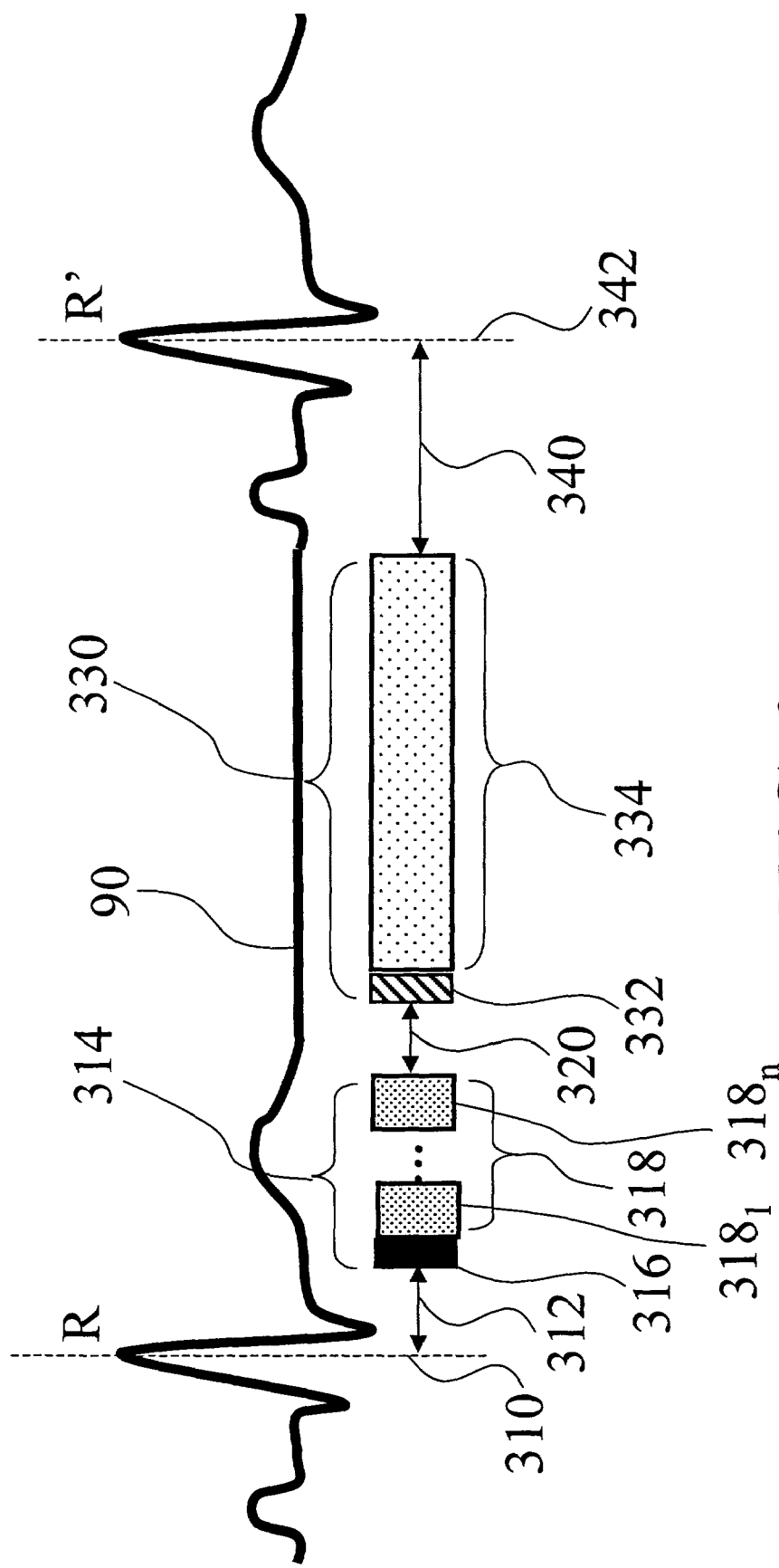
FIG. 9 schematically shows the timing diagram of another exemplary multiple-excitation cardiac imaging embodiment in which a plurality of different preparatory excitations and readouts are applied during a single cardiac cycle interval.

With continuing reference to FIG. 9, a second data acquisition sequence 330 includes a preparatory sequence block 332 which is different from the SPAMM tag 316, and an imaging sequence block 334. In the exemplary FIG. 9, the image acquisition block 334 acquires an entire image, i.e. the image acquisition block 334 does not employ segmenting over multiple cardiac cycle intervals. After the second data acquisition 330, the electrocardiogram 90 is monitored during a trigger window 340 for a recurrence 342 of the trigger event indicating a new cardiac cycle interval. The optional delay 320 situates the second data acquisition sequence 330 at a selected portion of the cardiac cycle interval, such as inside the diastolic phase as shown in FIG. 9.

Figure 10:
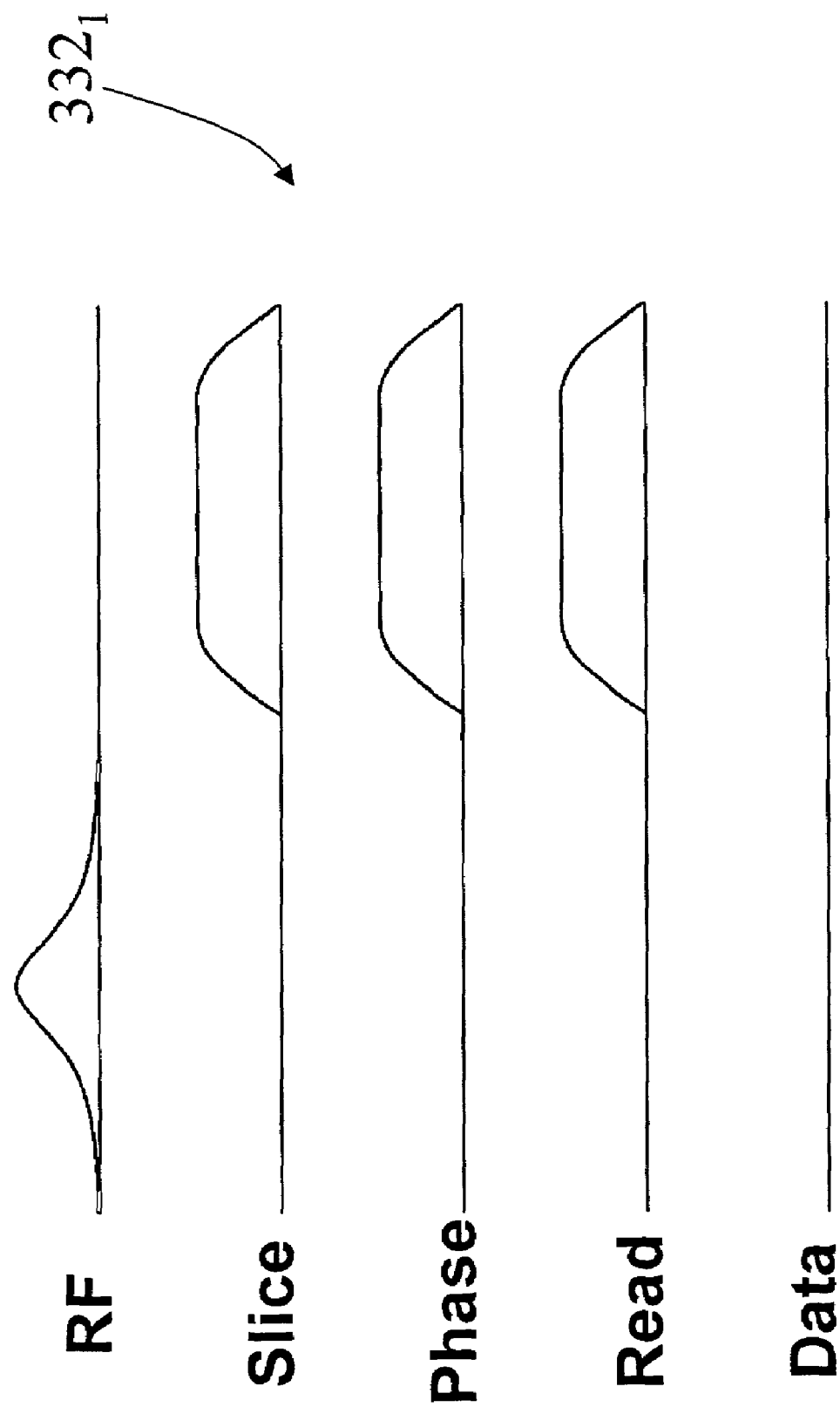
FIG. 10 schematically shows the timing diagram of a suitable non-SPAMM/CSPAMM preparatory sequence of FIG. 9, which effectuates preparatory spin inversion for subsequent inversion recovery (IR) perfusion imaging.

In one embodiment, the data acquisition sequence 330 acquires perfusion data. With reference to FIG. 10, in one exemplary preparatory sequence block $332_1$ a spin inversion is effectuated preparatory to inversion recovery (IR) imaging having enhanced blood perfusion contrast. In an alternative preparatory sequence block, with reference to FIG. 11 an exemplary saturation sequence block $332_2$ effectuates a spin saturation perfusion imaging preparation. The timing sequences $332_1$, $332_2$ are well-known to those skilled in the art and need not be detailed herein for an enabling disclosure of the preferred embodiments.

Figure 12:
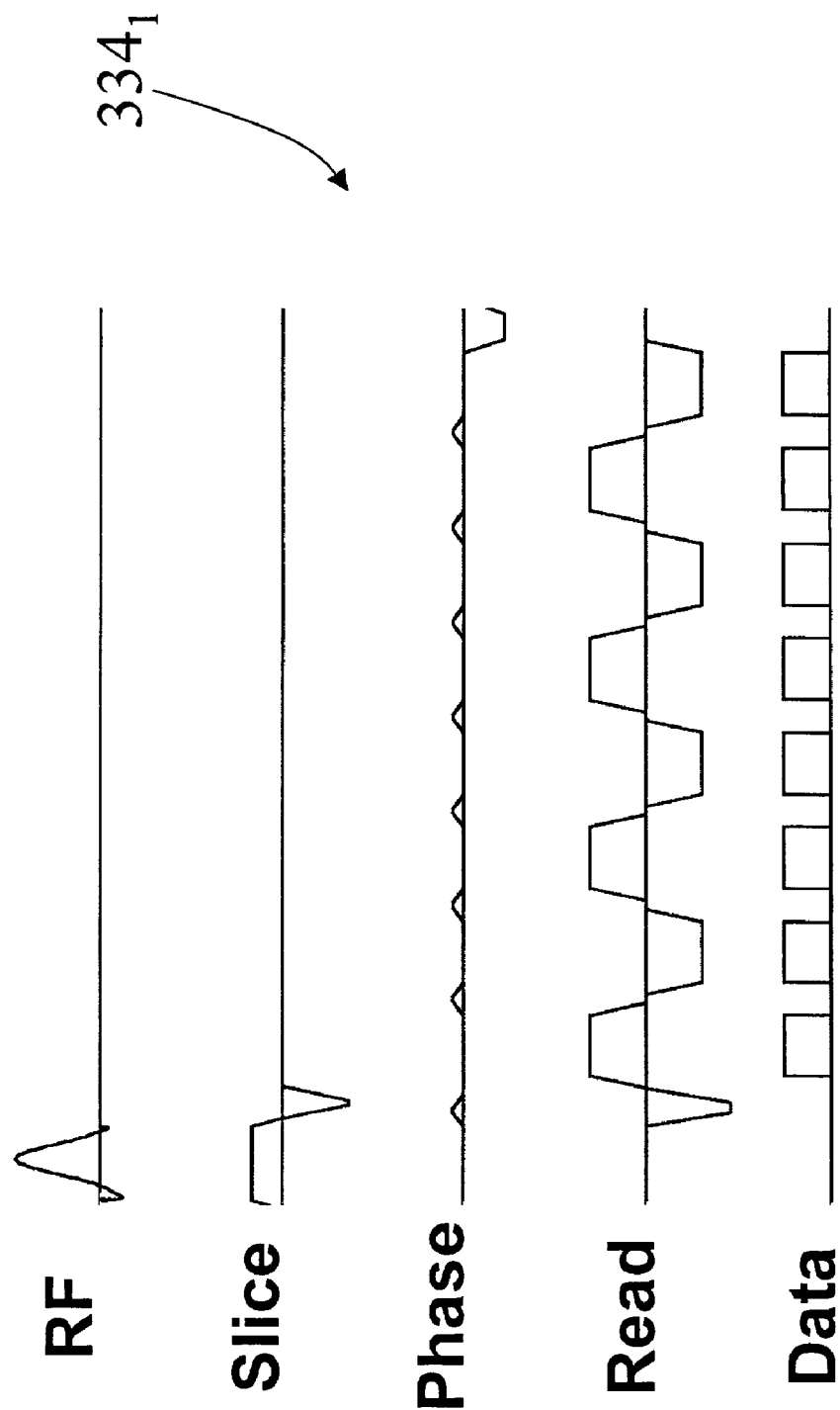
FIG. 12 schematically shows the timing diagram of a suitable embodiment of the non-SPAMM/CSPAMM imaging sequence of FIG. 10 which effectuates in cooperation with the magnetization saturation of FIG. 10 or 11 enhanced imaging of blood perfusion in tissues.

With reference to FIG. 12, an exemplary embodiment $334_1$ of a timing sequence that performs multi-echo gradient imaging suitable for perfusion data acquisition is shown. The timing sequence of $334_1$ is also well-known to those skilled in the art and need not be detailed herein. Those skilled in the art will also appreciate that many other types of imaging techniques can be employed for the perfusion imaging 334. Similarly, imaging of other physiological features beside perfusion can be performed, such as angiographic imaging. The imaging 334 could also use a velocity-encoded data acquisition sequence block (not shown) known to the art.

The embodiment of FIG. 9 employs segmented SPAMM or CSPAMM imaging associated with the first preparatory sequence block 316 which is a SPAMM tag, while the second preparatory sequence block 332 is used in conjunction with non-segmented imaging 334. Thus, acquisition of the entire SPAMM or CSPAMM k-space data set will occur over a plurality of cardiac cycle intervals, while a plurality of images of the type 334 will be acquired over the same cardiac cycle intervals.

With reference to FIG. 13, one exemplary embodiment of combined CSPAMM/perfusion imaging in accordance with the schematic cardiac cycle interval timing diagram of FIG. 9 is described. In FIG. 13, the CSPAMM imaging is segmented over sixteen cardiac cycles 360, including both the tagged 362 and complementarily tagged 364 data acquisitions. As shown, the tagged 362 and the complementarily tagged 364 k-space data acquisitions are alternated between cardiac cycle intervals 360. Thus, in a first cardiac cycle 366, tagged k-space lines 1, 9, 17, 25, 33, 41, 49, and 57 are acquired. In a second cardiac cycle 368 corresponding complementarily tagged k-space lines 1, 9, 17, 25, 33, 41, 49, and 57 are acquired.

The process is repeated every two cardiac cycles 360 until both tagged and complementarily tagged k-space lines 1 through 64 are acquired. This represents complete data for a segmented CSPAMM image representation (not shown) corresponding to 64 k-space data lines. The acquired data is reconstructed to form the CSPAMM image representation using reconstruction methods known to the art. Preferably, with reference returning to FIG. 9, a plurality of CSPAMM images $318_1$ . . . $318_n$ spanning a selected phase range 318 of the cardiac cycle interval subsequent to the application of the SPAMM tag 316 are acquired in accordance with the k-space line segmentation shown in FIG. 13.

With continuing reference to FIGS. 9 and 13, in addition to the CSPAMM acquisition 314, each cardiac cycle interval 360 includes a preparation sequence block 380 which in FIG. 13 is a spin inversion sequence block $332_1$ shown in FIG. 10. An image having enhanced perfusion contrast is acquired 382 during each cardiac cycle interval 360, e.g. using the timing sequence 334 of FIG. 12. Thus, the acquisition over sixteen cardiac cycle intervals of a single CSPAMM image also includes acquisition of sixteen images containing perfusion information. The sixteen images collectively provide information regarding the rate at which blood perfusion into the tissues occurs.

The described CSPAMM/perfusion imaging combination advantageously measures heart motion by CSPAMM during the systolic cardiac cycle phase and perfusion during the diastolic cardiac phase. The embodiment of FIG. 13 makes more complete use of the cardiac cycle interval versus prior art magnetic resonance imaging methods. Furthermore, the segmented acquisition of CSPAMM data over sixteen cardiac cycle intervals is practicable because the heart motion typically remains substantially uniform over many cardiac cycles. In contrast, perfusion of a contrast-agent 44 (FIG. 4) into the cardiac muscle occurs very rapidly, typically becoming substantially complete in a few seconds. Thus, acquisition of a complete perfusion image during each cardiac cycle provides image acquisition at a rate of approximately one image per second(for a heart rate of 60 beats per minute) which is sufficient to monitor the perfusion in real time.

With reference to FIG. 14, a variant embodiment of combined CSPAMM/perfusion imaging in accordance with the schematic cardiac cycle interval timing diagram of FIG. 9 is described. In FIG. 14, the first eight cardiac cycle intervals are used to acquire the tagged k-space lines, while the second eight cardiac cycle intervals are used to acquire the complementarily tagged k-space lines. Of course, the arrangements for segmenting the CSPAMM imaging shown in FIGS. 13 and 14 are exemplary only, and other possible k-space acquisition arrangements are also contemplated.

The SPAMM or CSPAMM segmentation over sixteen cardiac cycle intervals in FIGS. 13 and 14 is exemplary only. Segmentation performed over a larger number of cardiac cycle intervals provides more k-space lines corresponding to a higher image resolution. Segmentation over fewer cardiac cycle intervals reduces the likelihood of blurring due to patient motion. Typically, the breath hold time determines the interval during which blurring is negligible, and the breath hold time is patient-dependent. Similarly, the acquisition of eight k-space lines per cardiac cycle interval in FIGS. 13 and 14 is exemplary, and more or fewer k-space lines per cardiac cycle interval can be acquired. For SPAMM or CSPAMM segmentation over a fixed number of cardiac cycle intervals, a trade-off can be made between the number of image k-space lines acquired per cardiac cycle interval, which translates into image spatial resolution, and the number of images in the image sequence $318_1 \ldots 318_n$ (FIG. 9) which translates into temporal resolution.

Figure 15:
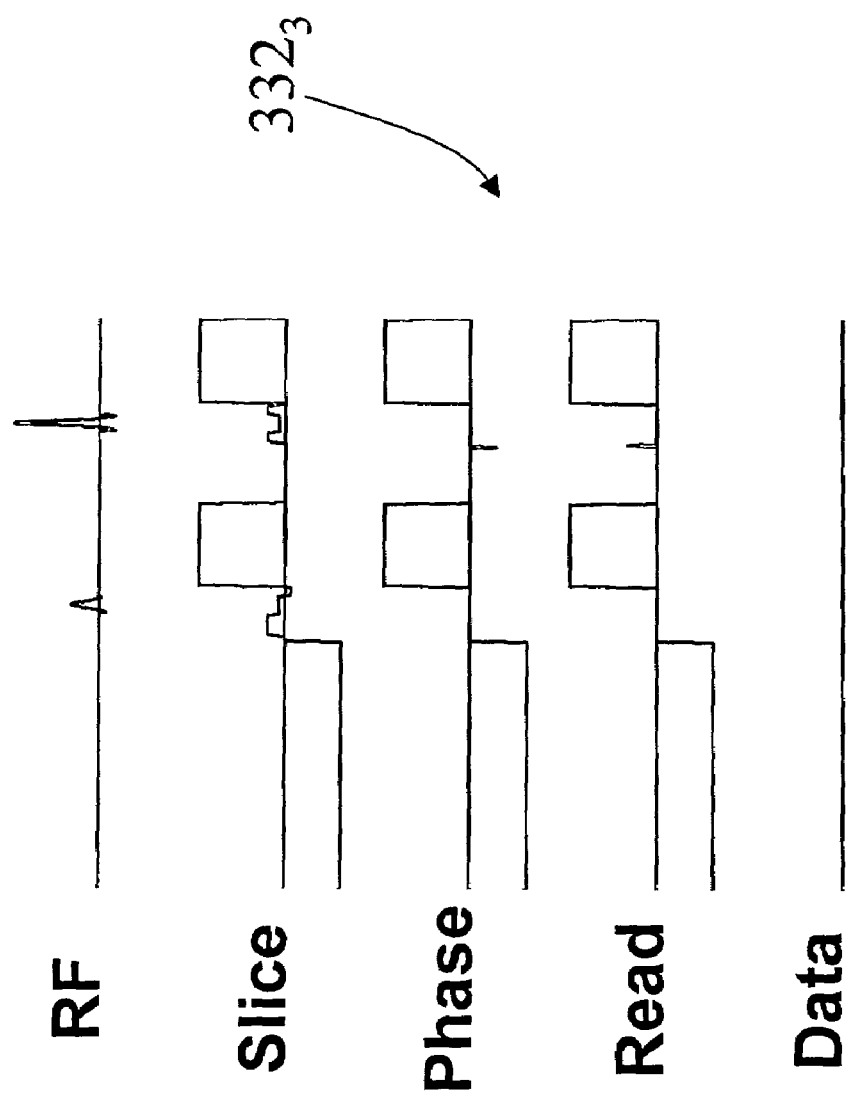
FIG. 15 shows an alternative preparatory sequence block for use in the timing diagram of FIG. 9.

With reference returning to FIG. 9 and with further reference to FIGS. 15 and 16, another exemplary embodiment of the data acquisition sequence 330 is shown which performs diffusion preparation and echo-planar imaging (EPI) readout. FIG. 15 shows an embodiment $332_3$ of the preparatory sequence 332 which provides diffusion preparation, and FIG. 16 shows an embodiment $334_2$ of a timing sequence for acquiring one of the images forming the sequence 334 which performs echo planar imaging (EPI). The timing sequences of $332_3$, $334_2$ are well-known to the art and need not be detailed herein for an enabling disclosure.

Figure 1:
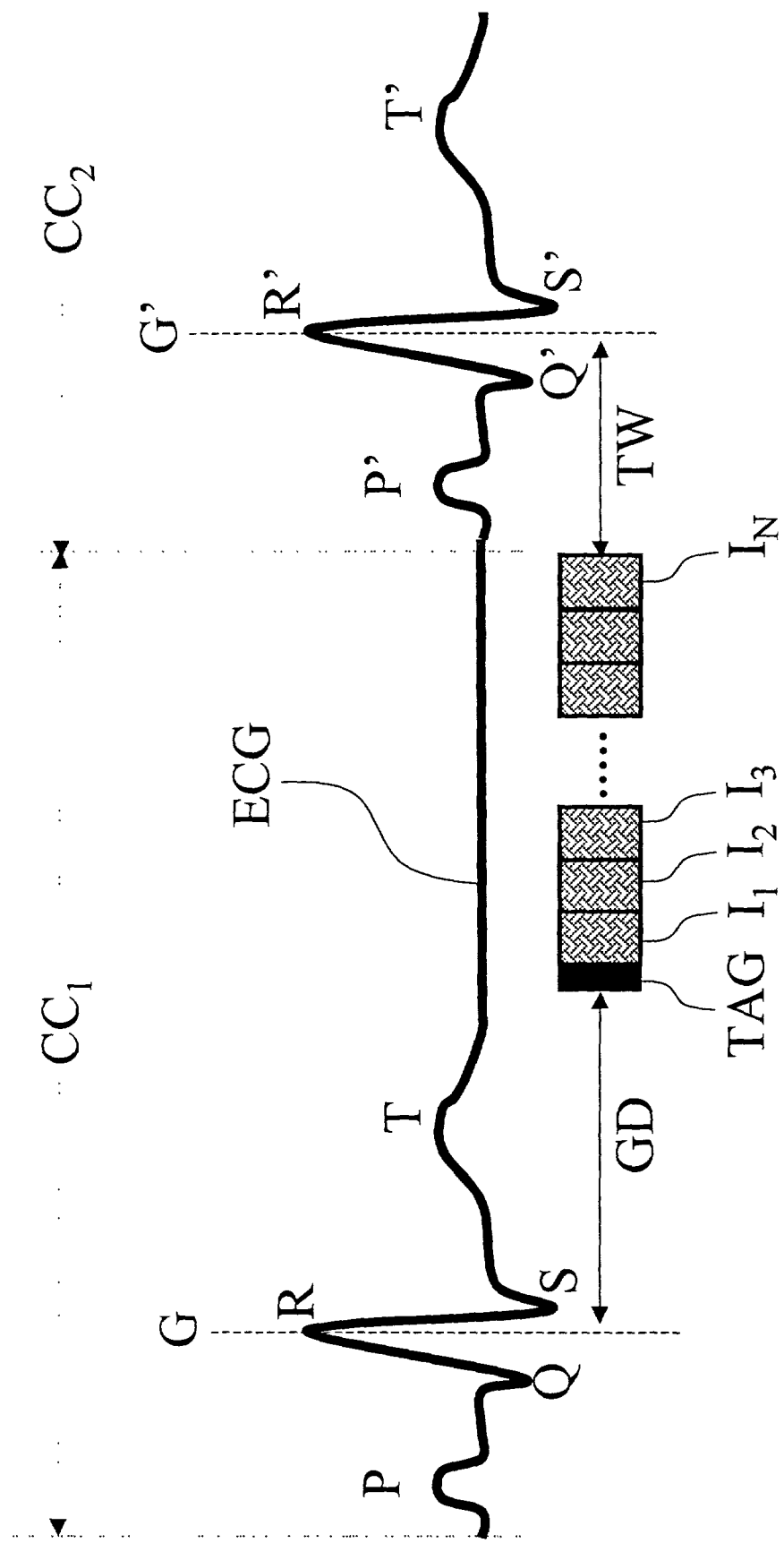
FIG. 1 schematically shows the timing diagram of a cardiac stress/strain/motion imaging sequence according to the prior art, referenced to a corresponding electrocardiogram, that employs a conventional spatial modulation of magnetization (SPAMM) preparatory tag.
Figure 2:
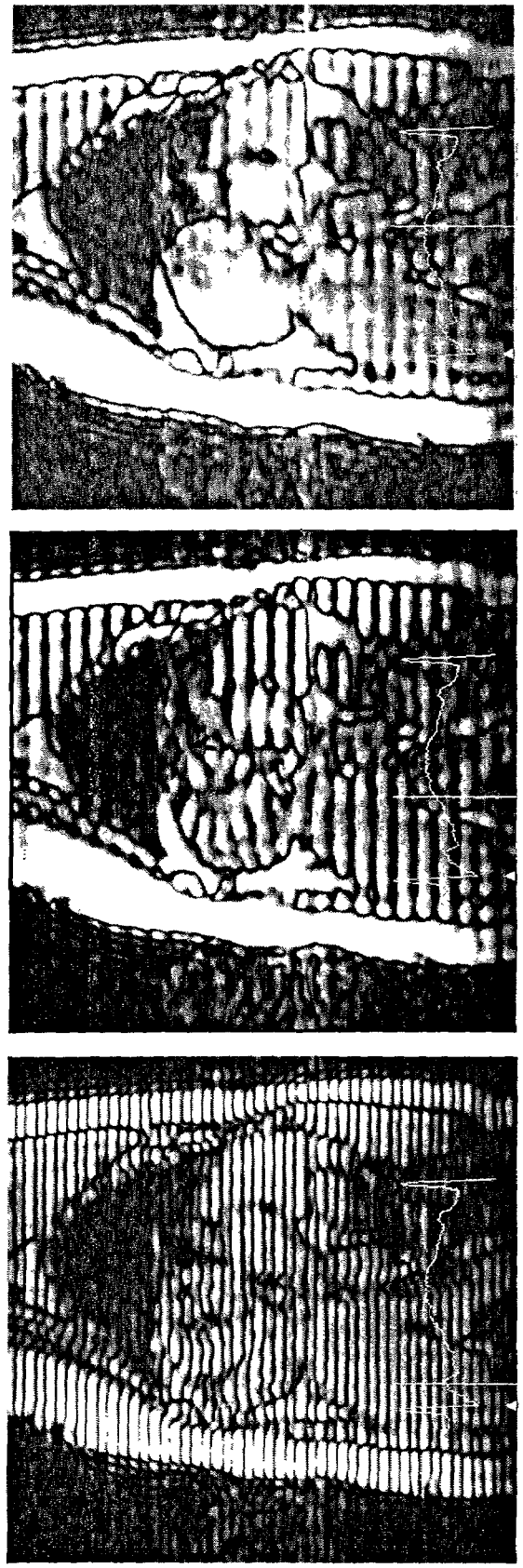
FIGS. 2A, 2B, 2C show exemplary conventional prior art SPAMM images at phases 3/64, 22/64, and 42/64, respectively, of the cardiac cycle interval.

It will be appreciated that the embodiments of FIGS. 9 through 16 are exemplary only. Those skilled in the art can vary the order, timing, and type of the multiple saturation or preparatory sequences and the corresponding imaging sequences to optimize the multiple-excitation cardiac cycle imaging for specific applications. With reference returning to FIG. 1, the heart is largely quiescent during the diastolic phase subsequent to the T-wave T. Thus, it is contemplated to include a plurality of imaging modes therein with appropriate preparatory sequence blocks for each and subsequent image fusion. For example, a perfusion imaging block and an angiographic imaging block can be inserted into the diastolic portion of the cardiac cycle interval and the images subsequently fused to provide more complete information on blood movement in the cardiac muscle during each cardiac cycle interval. Particularly in the case of contrast-enhanced MRI, combining contrast modalities during each cardiac cycle interval advantageously extracts maximum information over the limited time during which the contrast agent saturates the vascular systems.

With reference to FIG. 17, yet another exemplary embodiment is shown, which combines segmented SPAMM or CSPAMM 400 imaging with images 402 that show the late enhancement effect in a single cardiac cycle. As is known to the art, regions of myocardial injury typically exhibit measurably higher signal intensities versus healthy myocardium within a certain time frame after administration of certain types of contrast enhancement agent 44. This effect, often called late enhancement, is apparently due to delayed circulatory removal of the contrast agent from the regions of myocardial injury.

Figure 11:
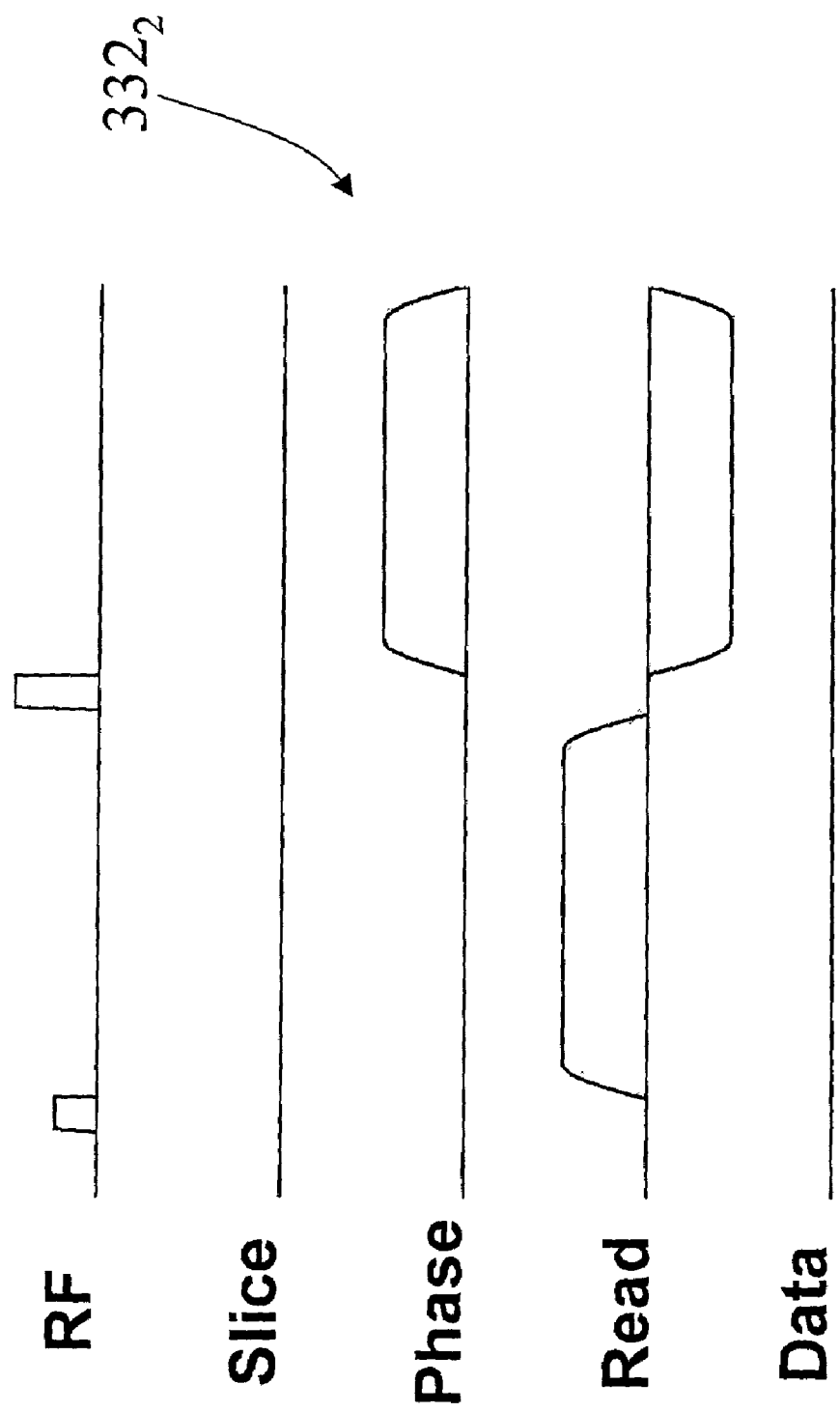
FIG. 11 schematically shows the timing diagram of a suitable non-SPAMM/CSPAMM preparatory sequence of FIG. 9, which effectuates preparatory saturation of magnetization that enhances perfusion image contrast.

The late enhancement effect can be imaged using the preparatory and readout timing sequence blocks $332_1$, $332_2$, $334_1$ of FIGS. 10 through 12, for example. However, the late enhancement contrast is weak, and so optimized imaging conditions are especially important. As shown in FIG. 17, the late enhancement portion 402 of the data acquisition 400, 402 is varied in a preselected manner for each successive cardiac cycle interval. In particular, each preparatory sequence block $404_1$, $404_2$, $404_3$, $404_4$ has a different flip angle $\alpha_1$, $\alpha_2$, $\alpha_3$ $\alpha_4$ and each readout block 406 a different delay $T_{i,1}$, $T_{i,2}$, $T_{i,3}$, $T_{i,4}$. The optimized late enhancement image can be selected from the resulting varied conditions. Since the late enhancement acquisition is combined with segmented SPAMM or CSPAMM imaging through the use of multiple preparatory tags and readouts in each cardiac cycle interval, this additional data is obtained without any corresponding increase in imaging time versus performing the segmented SPAMM or CSPAMM by itself.

Figure 3:
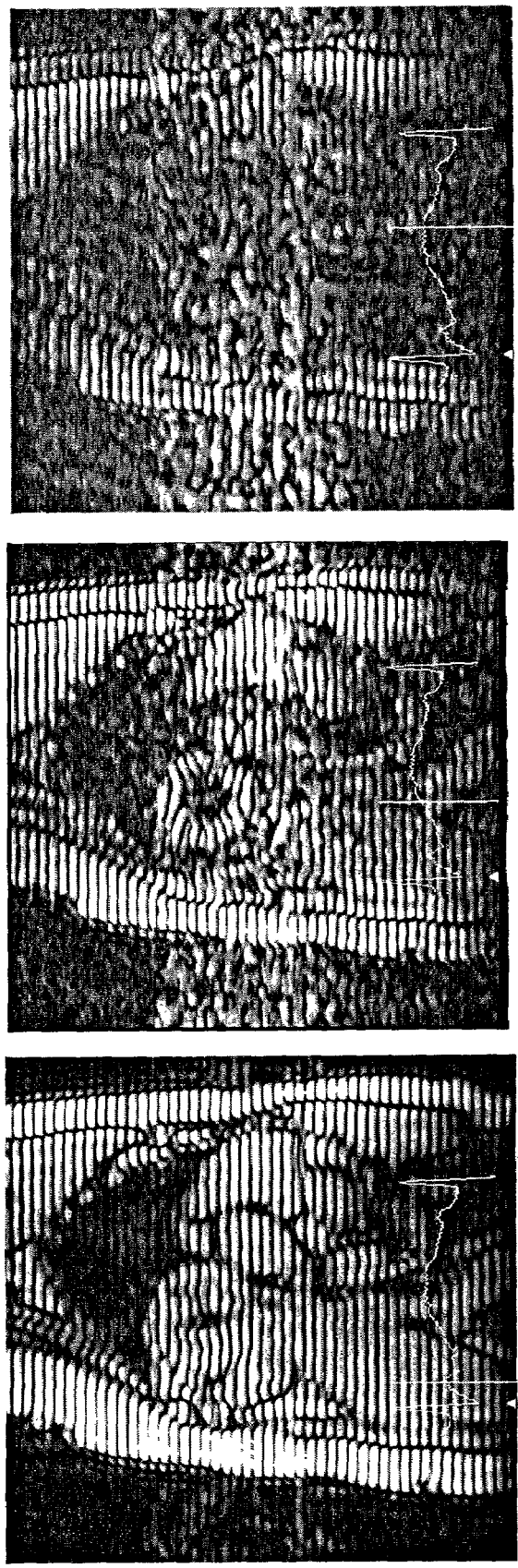
FIGS. 3A, 3B, 3C show exemplary conventional prior art complementary SPAMM (CSPAMM) images at phases 3/64, 22/64, and 42/64, respectively, of the cardiac cycle interval.

With reference to FIGS. 18A, 18B, and 18C, results for an exemplary application of multi-excitation CSPAMM imaging are presented. These imaging results should be compared with the analogous conventional CSPAMM images of FIGS. 3A, 3B, and 3C. It will be seen that the images $IMC_{3/64}$ and $IC_{3/64}$ corresponding to multi-excitation CSPAMM and conventional CSPAMM, respectively, and taken at phase=3/64 are quite similar to each other, as are the corresponding images $IMC_{22/64}$ and $IC_{22/64}$ which are taken at phase=22/64. However, the sequences diverge at phase=32 (not shown), because in the multiple-excitation CSPAMM the second tag 122 (FIG. 6) is applied at phase=32 of the cardiac cycle. As clearly seen by comparing FIG. 18C with FIG. 3C, the multiple-excitation CSPAMM image $IMC_{42/64}$ has clearly defined tags contrast and clearly defined cardiac image contrast, whereas the corresponding conventional CSPAMM image $IC_{42/64}$ has a substantially faded or washed out image contrast. It will be recognized that the tags in the image $IMC_{42/64}$ do not register with the tags of the image $IMC_{22/64}$ due to the intervening application of the second tag 122. However, the multiple-excitation CSPAMM imaging of FIGS. 18A, 18B, 18C do provide useful cardiac cycle force/stress/motion information throughout the cardiac cycle interval, whereas the conventional CSPAMM does not provide useful information at phase=42/64 of the cardiac cycle or beyond.

Another important advantage of the invention is reduced radiation exposure of the patient. With reference returning to FIG. 1, in conventional SPAMM or CSPAMM, only a single tag TAG is applied in each cardiac cycle interval. In order for the magnetization of the tag TAG to persist as long as possible, a large angle of excitation corresponding to strong magnetic field gradients and RF pulses are applied during the tagging. These large field gradients and RF magnitudes corresponds to a high specific absorption ratio (SAR) delivered to the patient during the cardiac cycle interval.

In contrast, with reference to FIG. 6, in multiple-excitation SPAMM or CSPAMM two or more SPAMM tags 114, 122 are applied over the cardiac cycle interval, and each tag need only persist for a half cardiac cycle interval or less. Thus, each tagging can use a smaller angle of excitation corresponding to lower gradients and RF pulse amplitudes, and the SAR delivered to the patient is reduced accordingly. Multiple SPAMM tags each having a smaller flip angle versus a single high energy SPAMM tag can reduce the SAR delivered to the patient. For example, it has been calculated that for a rectangular $B_1$ pulse the total SAR is proportional to the square of the flip angle, while the tip of the flip angle is estimated to be proportional (to some order) to the persistence of the tag. Thus, where a deep, high-angle pulse (such as a max 90 degree pulse), may exceed limits of tolerable SAR, distributing the preparatory excitation over the cardiac cycle can give the same excitation persistence with a lower total SAR. Using lower SAR tags in multiple-excitation SPAMM or CSPAMM also advantageously reduces the overlap of magnetization produced by successive tags. Of course, these same considerations apply generally to other types of preparatory sequences, such as the preparatory sequences $332_1$, $332_2$, $332_3$ of FIGS. 10, 11, and 15.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance cardiac imaging method for imaging a heart, the method comprising
applying a data acquisition sequence including:
a first preparation sequence block,
a first imaging sequence block having at least one readout interval that collects first data, the first imaging sequence block effectuates data acquisition having a first image contrast type
a second preparation sequence block, and
a second imaging sequence block having at least one readout interval that collects second data, the second imaging sequence block effectuates data acquisition having a second image contrast type that is different from the first image contrast type,
the data acquisition sequence occupying an acquisition time interval which is less than a cardiac cycle interval of the heart.

2. The method as set forth in claim 1, further including:
monitoring an electrocardiographic signal associated with the heart for a first trigger event; and
responsive to the first trigger event, initiating the applying of the data acquisition sequence.

3. The method as set forth in claim 2, further including:
providing a gating delay interval between the first trigger event and the start of the data acquisition sequence, the gating delay interval plus a time of the data acquisition sequence together being less than the cardiac cycle interval.

4. The method as set forth in claim 3 further including:
providing a trigger window interval trailing the data acquisition sequence; and
terminating the trigger window interval responsive to detection of a second trigger event.

5. The method as set forth in claim 1, wherein:
the first preparation sequence block performs a first magnetization preparation affecting at least a portion of the heart; and
the second preparation sequence block performs a second magnetization preparation affecting at least a portion of the heart, wherein the second magnetization preparation is different from the first magnetization preparation.

6. The method as set forth in claim 1, wherein at least one of the first preparation sequence block and the second preparation sequence block performs at least one of spatial modulation of magnetization (SPAMM) and complementary spatial modulation of magnetization (CSPAMM) tagging of at least a portion of the cardiac muscle.

7. The method as set forth in claim 1, wherein one of:
the first preparation sequence block combined with the first imaging sequence block, and
the second preparation sequence block combined with the second imaging sequence block,
effectuates acquisition of imaging data with one of superimposed spatial modulation of magnetization (SPAMM) tagging and superimposed complementary spatial modulation of magnetization (CSPAMM) tagging.

8. The method as set forth in claim 1, wherein:
the first preparation sequence block applies a first spatial modulation of magnetization tagging; and
the second preparation sequence block applies a second spatial modulation of magnetization tagging.

9. The method as set forth in claim 8, further including:
monitoring an electrocardiographic signal associated with the heart for a first trigger event;
responsive to the first trigger event, initiating the applying of the data acquisition sequence;
monitoring an electrocardiographic signal associated with the heart for a second trigger event temporally located at least one cardiac cycle interval distant from the first trigger event;
responsive to the second trigger event, applying a complementary data acquisition sequence including:
a third preparation sequence block complementary to the first preparation sequence block,
a third imaging sequence block having at least one readout interval that collects third data,
a fourth preparation sequence block complementary to the second preparation sequence block, and
a fourth imaging sequence block having at least one readout interval that collects fourth data,
the complementary data acquisition sequence occupying a complementary acquisition time interval which is less than the cardiac cycle interval of the heart.

10. The method as set forth in claim 9, further including:
repeating the data acquisition sequence and the complementary data acquisition sequence over a plurality of cardiac cycle intervals to form first, second, third, and fourth segmented k-space data sets;
generating a first CSPAMM segmented k-space data set by subtractively combining the first segmented k-space data set and the third segmented k-space data set;
generating a second CSPAMM segmented k-space data set by subtractively combining the second segmented k-space data and the fourth segmented k-space data set; and
reconstructing first and second CSPAMM segmented k-space data sets to generate first and second CSPAMM image representations each including at least one image.

11. The method as set forth in claim 9, further including:
repeating the data acquisition sequence and the complementary data acquisition sequence over a plurality of cardiac cycle intervals to form first, second, third, and fourth segmented k-space data sets;
combining the first segmented k-space data set with the third segmented k-space data set to generate a first complementary spatial modulation of magnetization (CSPAMM) image sequence; and
combining the second segmented k-space data set with the fourth segmented k-space data set to generate a second CSPAMM image sequence.

12. A magnetic resonance cardiac imaging method for imaging a heart, the method comprising:
applying a data acquisition sequence including:
a first preparation sequence block,
a first imaging sequence block having at least one readout interval that collects first data,
a second preparation sequence block, and
a second imaging sequence block having at least one readout interval that collects second data,
one of:
the first preparation sequence block combined with the first imaging sequence block, and the second preparation sequence block combined with the second imaging, sequence block, effectuating acquisition of imaging data with one of superimposed spatial modulation of magnetization (SPAMM) tagging and superimposed complementary spatial modulation of magnetization (CSPAMM) tagging, the other of:
the first preparation sequence block combined with the first imaging sequence block, and the second preparation sequence block combined with the second imaging sequence block, characterizes blood perfusion or late enhancement;
the data acquisition sequence occupying an acquisition time interval which is less than a cardiac cycle interval of the heart.

13. The method as set forth in claim 2, further including:
measuring the cardiac cycle interval using the monitored electrocardiographic signal;
timing the application of the data acquisition sequence to the cardiac cycle based on the measured cardiac cycle interval; and
temporally registering at least one of first data and second data with the electrocardiographic signal using retrospective gating.

14. A magnetic resonance cardiac imaging method comprising:
applying a data acquisition sequence including:
in a first preparation sequence block, performing SPAMM or CSPAMM tagging of at least a portion of a cardiac muscle,
in a first imaging sequence block having at least one readout interval, collecting first data during a first fraction of the same cardiac cycle,
in a second preparation sequence block applied in the same cardiac cycle, acquiring one of perfusion imaging data and late enhancement imaging data, and
in a second imaging sequence block applied in the same cardiac cycle having at least one readout interval, collecting second data.

15. The method as set forth in claim 14, further including:
repeating the applying of the data acquisition sequence over a plurality of cardiac cycle intervals;
combining the first data acquired over the plurality of cardiac cycle intervals to form first segmented data corresponding to at least one segmented SPAMM or CSPAMM image;
combining the second data acquired over the plurality of cardiac cycle intervals to form second image sequence data corresponding to a plurality of images having perfusion or late enhancement contrast;
reconstructing first segmented data to form at least one SPAMM or CSPAMM image representation; and
reconstructing second image sequence data to form a plurality of images having perfusion or late enhancement contrast.

16. A magnetic resonance imaging apparatus for reducing the specific absorption ratio (SAR) received by a patient during magnetic resonance imaging of a cardiac cycle interval, the apparatus including control software which implements a method comprising:
applying a first preparatory sequence block to the patient at a first point in the cardiac cycle interval;
acquiring first image data having a first contrast type responsive to the first preparatory sequence block;
applying a second preparatory sequence block to the patient at a second point in said cardiac cycle interval different from the first point in said cardiac cycle; and
acquiring second image data having a second contrast type that is different from the first contrast type responsive to the second preparatory sequence block, the total time interval over which the applying of the first preparatory sequence block, the acquiring of first image data, the applying of the second preparatory sequence block, and the acquiring of second image data occur is being less than a single cardiac cycle interval.

17. An apparatus for acquiring image data associated with cardiac cycling of a heart, the apparatus comprising:
a magnetic resonance imaging (MRI) scanner arranged to interact with at least a portion of the heart;
an electrocardiograph that monitors the cardiac cycling;
an imaging sequence processor communicating with the MRI scanner and the electrocardiograph to perform an MRI data acquisition sequence with timing coordinated by a signal from the electrocardiograph, the data acquisition sequence including:
a first preparatory sequence block initiated at a first point in a cardiac cycle that produces a first modification of heart magnetization,
a first imaging sequence block including at least one readout that produces first image data associated with the heart, the first preparatory sequence block and the first imaging sequence block cooperate to effectuate a first imaging contrast,
a second preparatory sequence block spaced apart from the first preparatory sequence block and initiated at a second point different from the first point in the same cardiac cycle that produces a second modification of heart magnetization, and
a second imaging sequence block including at least one readout that produces second image data associated with the heart,
the data acquisition sequence occurring over an acquisition time interval which is smaller than a cardiac cycle interval, the second preparatory sequence block and the second imaging sequence block cooperate to effect a second imaging contrast, and
a reconstruction processor that reconstructs first and second image data to form a plurality of image representations of the heart which are associated with selected portions of the cardiac cycle.

18. The apparatus as set forth in claim 17, wherein at least one of the first preparatory sequence block and the second preparatory sequence block produces a spatially modulated heart magnetization.

19. The apparatus as set forth in claim 17, wherein the first preparatory sequence block and the second preparatory sequence block effectuate different modifications of the heart magnetization.

20. The apparatus as set forth in claim 17, wherein the first imaging contrast is different from the second imaging contrast.

21. The apparatus as set forth in claim 17, wherein the data acquisition sequence further includes:
a third preparatory sequence block that produces a third modification of heart magnetization; and
a third imaging sequence block including at least one readout that produces third image data associated with the heart.

* * * * *